(12) United States Patent
Park

(10) Patent No.: US 11,223,025 B2
(45) Date of Patent: Jan. 11, 2022

(54) FOLDABLE DISPLAY DEVICE

(71) Applicant: Samsung Display Co., Ltd., Yongin-si (KR)

(72) Inventor: Myoung Seo Park, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 145 days.

(21) Appl. No.: 16/216,393

(22) Filed: Dec. 11, 2018

(65) Prior Publication Data

US 2019/0355927 A1 Nov. 21, 2019

(30) Foreign Application Priority Data

May 15, 2018 (KR) .......................... 10-2018-0055195

(51) Int. Cl.
| | | |
|---|---|---|
| *H01L 51/52* | (2006.01) | |
| *H05K 5/00* | (2006.01) | |
| *H01L 51/56* | (2006.01) | |
| *H05K 5/03* | (2006.01) | |
| *H01L 27/32* | (2006.01) | |

(52) U.S. Cl.
CPC ...... *H01L 51/5246* (2013.01); *H01L 51/5253* (2013.01); *H01L 51/56* (2013.01); *H05K 5/0017* (2013.01); *H05K 5/03* (2013.01); *H01L 27/3244* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 8,492,974 B2* | 7/2013 | Lee ..................... | H01L 51/5256 313/506 |
| 8,680,539 B2 | 3/2014 | Shim et al. | |
| 9,356,087 B1* | 5/2016 | Lee ..................... | H01L 27/1218 |
| 2014/0145155 A1 | 5/2014 | Park | |
| 2015/0036300 A1* | 2/2015 | Park ....................... | H01L 27/32 361/749 |
| 2015/0147532 A1* | 5/2015 | Nam ....................... | B32B 27/08 428/172 |
| 2016/0118416 A1* | 4/2016 | Yamazaki .......... | G02F 1/136213 349/38 |

(Continued)

FOREIGN PATENT DOCUMENTS

| | | |
|---|---|---|
| KR | 10-2017-0099944 A | 9/2017 |
| KR | 10-2017-0140491 A | 12/2017 |

*Primary Examiner* — Richard H Kim
(74) *Attorney, Agent, or Firm* — Kile Park Reed & Houtteman PLLC

(57) ABSTRACT

A foldable display device includes a flexible display module having an electroluminescent unit, a flexible functional module on the flexible display, the flexible functional module having at least one function selected from the group of polarization, a color filtering, color conversion, a touch sensing, and biometric information recognition, and a flexible window module on the flexible functional module. A side surface of the flexible display module, a side surface of the flexible functional module, and a side surface of the flexible window module may be located on a first plane at a first side portion. An inner angle formed by an upper surface of the flexible window module emitting light and the first plane may be an acute angle at the first side portion.

56 Claims, 12 Drawing Sheets

(56) References Cited

U.S. PATENT DOCUMENTS

| | | | |
|---|---|---|---|
| 2016/0204373 A1* | 7/2016 | Park | H01L 27/3246 |
| | | | 257/40 |
| 2016/0380232 A1 | 12/2016 | Yi et al. | |
| 2017/0352834 A1* | 12/2017 | Kim | H01L 27/3276 |
| 2018/0150108 A1* | 5/2018 | Song | H05K 1/028 |
| 2018/0269261 A1 | 9/2018 | Park | |
| 2018/0269427 A1 | 9/2018 | Park | |
| 2019/0006444 A1* | 1/2019 | Nishimura | H04M 1/0268 |
| 2019/0214595 A1 | 7/2019 | Park | |

* cited by examiner

FOLDABLE DISPLAY DEVICE

CROSS-REFERENCE TO RELATED APPLICATION

Korean Patent Application No. 10-2018-0055195 filed on May 15, 2018, in the Korean Intellectual Property Office, and entitled: "Foldable Display Device," is incorporated by reference herein in its entirety.

BACKGROUND

1. Field

Example embodiments relate to a foldable display device.

2. Description of the Related Art

A display device is a device for displaying an image and includes a display panel such as an organic light emitting display panel or a liquid crystal display panel.

A mobile electronic device includes a display device for providing an image to a user. A foldable display device or a bendable display device having a structure that can be folded and unfolded to provide a larger screen only at the time of use is desirable.

SUMMARY

Exemplary embodiments of the present invention provide a foldable display device. The foldable display device may include a flexible display module, a flexible functional module, a first double-sided adhesive film, and a flexible window module. The flexible display module may include a main region which has a display area including an electroluminescent unit. The flexible functional module may be on the flexible display module. The flexible functional module may have at least one function selected from a group of polarization, color filtering, color conversion, and touch sensing. The first double-sided adhesive film may be on the flexible functional module. The flexible window module may be on the first double-sided adhesive film. At a first side portion of the foldable display device, at least one selected from a group of a side surface portion of the flexible display module and a side surface portion of the flexible functional module may be located substantially on a first etching plane substantially on which a side surface portion of the flexible window module is located. The first etching plane may be by at least one laser etching processes. The first side portion of the foldable display device may have a first sidewall shape. The flexible display module may include a lower inorganic encapsulation structure and an upper encapsulation structure which has a lower surface including only at least one inorganic material. The flexible display module may include an inorganic-inorganic contact closed loop at which the lower surface of the upper encapsulation structure contacts the lower inorganic encapsulation structure. The electroluminescent unit may be located between the lower inorganic encapsulation structure and the upper encapsulation structure. The electroluminescent unit may be surrounded by the inorganic-inorganic contact closed loop in plan view. The inorganic-inorganic contact closed loop may be spaced apart from the side surface portion of the flexible display module. The foldable display device may have a second side portion having a second sidewall shape substantially different from the first sidewall shape of the first side portion. The foldable display device may have a third side portion having a third sidewall shape substantially different from the first and second sidewall shapes of the first and second side portions. The flexible display module may further include a sub region in which a pad is provided and a bent region located at the third side portion of the foldable display device and bent between the main region and the sub region. The second side portion of the foldable display device may be located between the first and third side portions of the foldable display device in plan view.

Exemplary embodiments of the present invention provide a foldable display device. The foldable display device may comprise a flexible display module, a flexible functional module, a first double-sided adhesive film, and a flexible window module. The flexible display module may include a main region which has a display area including an electroluminescent unit. The flexible functional module may be on the flexible display module. The flexible functional module may have at least one function selected from a group of polarization, color filtering, color conversion, and touch sensing. The first double-sided adhesive film may be on the flexible functional module. The flexible window module may be on the first double-sided adhesive film. At a first side portion of the foldable display device, a side surface portion of the flexible functional module may be located substantially on a first etching plane substantially on which a side surface portion of the flexible display module is located. The first etching plane may be by at least one laser etching processes. The first side portion of the foldable display device may have a first sidewall shape. The flexible display module may include a lower inorganic encapsulation structure and an upper encapsulation structure which has a lower surface including only at least one inorganic material. The flexible display module may include an inorganic-inorganic contact closed loop at which the lower surface of the upper encapsulation structure contacts the lower inorganic encapsulation structure. The electroluminescent unit may be located between the lower inorganic encapsulation structure and the upper encapsulation structure. The electroluminescent unit may be surrounded by the inorganic-inorganic contact closed loop in plan view. The inorganic-inorganic contact closed loop may be spaced apart from the side surface portion of the flexible display module. The foldable display device may have a second side portion having a second sidewall shape substantially different from the first sidewall shape of the first side portion. The foldable display device may have a third side portion having a third sidewall shape substantially different from the first and second sidewall shapes of the first and second side portions. The flexible display module may further include a sub region in which a pad is provided and a bent region located at the third side portion of the foldable display device and bent between the main region and the sub region. The second side portion of the foldable display device may be located between the first and third side portions of the foldable display device in plan view.

Exemplary embodiments of the present invention provide a mobile terminal with a foldable display device. The foldable display device may provide an image displayed from the mobile terminal. The mobile terminal is for a final human consumer. The final human consumer may communicate, access data, download data, or handle information by using the mobile terminal. The foldable display device may provide an image displayed from the mobile terminal. The foldable display device may comprise a flexible display module, a flexible functional module, a first double-sided adhesive film and a flexible window module. The flexible display module may include a main region which has a display area including an electroluminescent unit. The flexible functional module may be on the flexible display module. The flexible functional module may have at least one function selected from a group of polarization, color filtering, color conversion, and touch sensing. The first double-sided adhesive film may be on the flexible functional module. The flexible window module may be on the first double-sided adhesive film. At a first side portion of the foldable display device, at least one selected from a group of a side surface portion of the flexible display module and a side surface portion of the flexible functional module may be located substantially on a first etching plane substantially on which a side surface portion of the flexible window module is located. The first side portion of the foldable display device may have a first sidewall shape. The flexible display module may include a lower inorganic encapsulation structure and an upper encapsulation structure which has a lower surface including only at least one inorganic material. The flexible display module may include an inorganic-inorganic contact closed loop at which the lower surface of the upper encapsulation structure contacts the lower inorganic encapsulation structure. The electroluminescent unit may be located between the lower inorganic encapsulation structure and the upper encapsulation structure. The electroluminescent unit may be surrounded by the inorganic-inorganic contact closed loop in plan view. The inorganic-inorganic contact closed loop may be spaced apart from the side surface portion of the flexible display module. The foldable display device may have a second side portion having a second sidewall shape substantially different from the first sidewall shape of the first side portion. The foldable display device may have a third side portion having a third sidewall shape substantially different from the first and second sidewall shapes of the first and second side portions. The flexible display module may further include a sub region in which a pad is provided and a bent region located at the third side portion of the foldable display device and bent between the main region and the sub region. The second side portion of the foldable display device may be located between the first and third side portions of the foldable display device in plan view.

Exemplary embodiments of the present invention provide a mobile terminal with a foldable display device. The foldable display device may provide an image displayed from the mobile terminal. The mobile terminal is for a final human consumer. The final human consumer may communicate, access data, download data, or handle information by using the mobile terminal. The foldable display device may comprise a flexible display module, a flexible functional module, a first double-sided adhesive film, and a flexible window module. The flexible display module may include a main region which has a display area including an electroluminescent unit. The flexible functional module may be on the flexible display module. The flexible functional module may have at least one function selected from a group of polarization, color filtering, color conversion, and touch sensing. The first double-sided adhesive film may be on the flexible functional module. The flexible window module may be on the first double-sided adhesive film. At a first side portion of the foldable display device, a side surface portion of the flexible functional module may be located substantially on a first etching plane substantially on which a side surface portion of the flexible display module is located. The first side portion of the foldable display device may have a first sidewall shape. The flexible display module may include a lower inorganic encapsulation structure and an upper encapsulation structure which has a lower surface including only at least one inorganic material. The flexible display module may include an inorganic-inorganic contact closed loop at which the lower surface of the upper encapsulation structure contacts the lower inorganic encapsulation structure. The electroluminescent unit may be located between the lower inorganic encapsulation structure and the upper encapsulation structure. The electroluminescent unit may be surrounded by the inorganic-inorganic contact closed loop in plan view. The inorganic-inorganic contact closed loop may be spaced apart from the side surface portion of the flexible display module. The foldable display device may have a second side portion having a second sidewall shape substantially different from the first sidewall shape of the first side portion. The foldable display device may have a third side portion having a third sidewall shape substantially different from the first and second sidewall shapes of the first and second side portions. The flexible display module may further include a sub region in which a pad is provided and a bent region located at the third side portion of the foldable display device and bent between the main region and the sub region. The second side portion of the foldable display device may be located between the first and third side portions of the foldable display device in plan view.

BRIEF DESCRIPTION OF THE DRAWINGS

Features will become apparent to those of skill in the art by describing in detail example embodiments with reference to the attached drawings in which.

DETAILED DESCRIPTION

Figure 1:
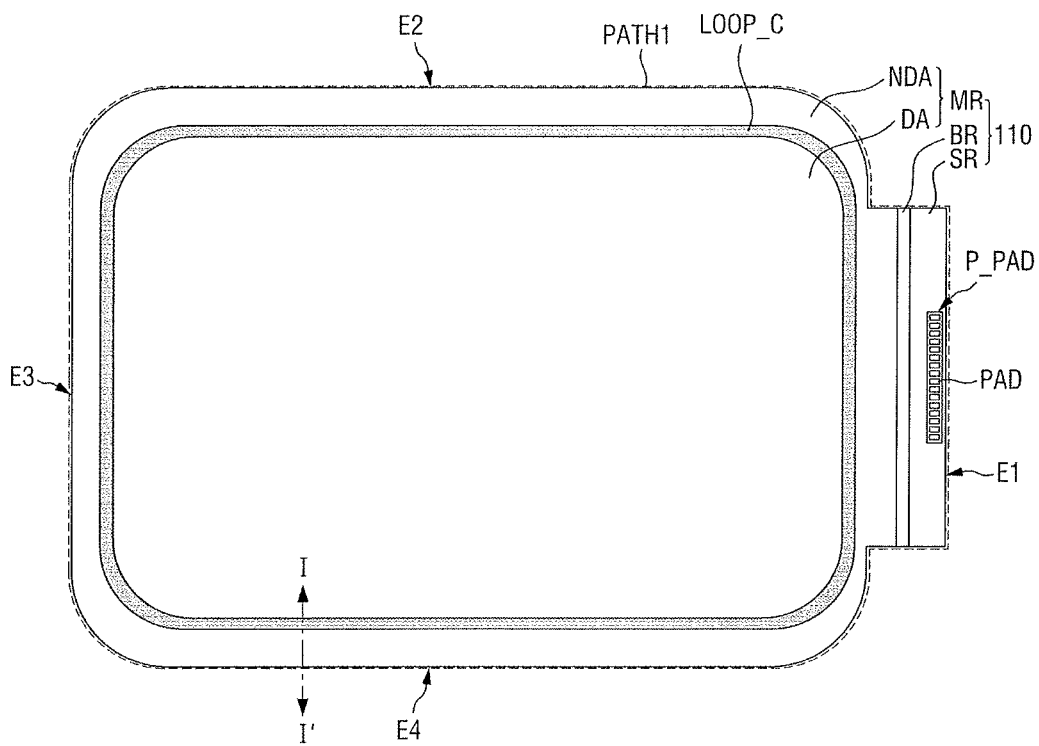
FIGS. 1 to 10 illustrate diagrams of a foldable display device and stages of a manufacturing method of the foldable display device according to an example embodiment.

Example embodiments will now be described more fully hereinafter with reference to the accompanying drawings; however, they may be embodied in different forms and should not be construed as limited to the example embodiments set forth herein. Rather, these example embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout. As used herein, the expressions "at least one," "one or more," and "and/or" are open-ended expressions that are both conjunctive and disjunctive in operation. For example, each of the expressions "at least one selected from the group of A, B, and C," "at least one of A, B, and C," "at least one of A, B, or C," "one or more of A, B, and C," "one or more of A, B, or C,"

and "A, B, and/or C" includes the following meanings: at least one A alone; at least one B alone; at least C alone; both at least one A and at least one B together; both at least one A and at least one C together; both at least one B and at least one C together; and all three of at least one A, at least one B, and at least one C together. Further, these expressions are open-ended, unless expressly designated to the contrary by their combination with the term "consisting of." For example, the expression "at least one selected from the group of A, B, and C" may also include a fourth member, whereas the expression "at least one selected from the group consisting of A, B, and C" does not. As used herein, the expression "or" is not an "exclusive or" unless it is used in conjunction with the phrase "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

FIGS. 1 to 10 illustrate diagrams of a foldable display device and stages of a manufacturing method of the foldable display device according to an example embodiment.

Figure 2:
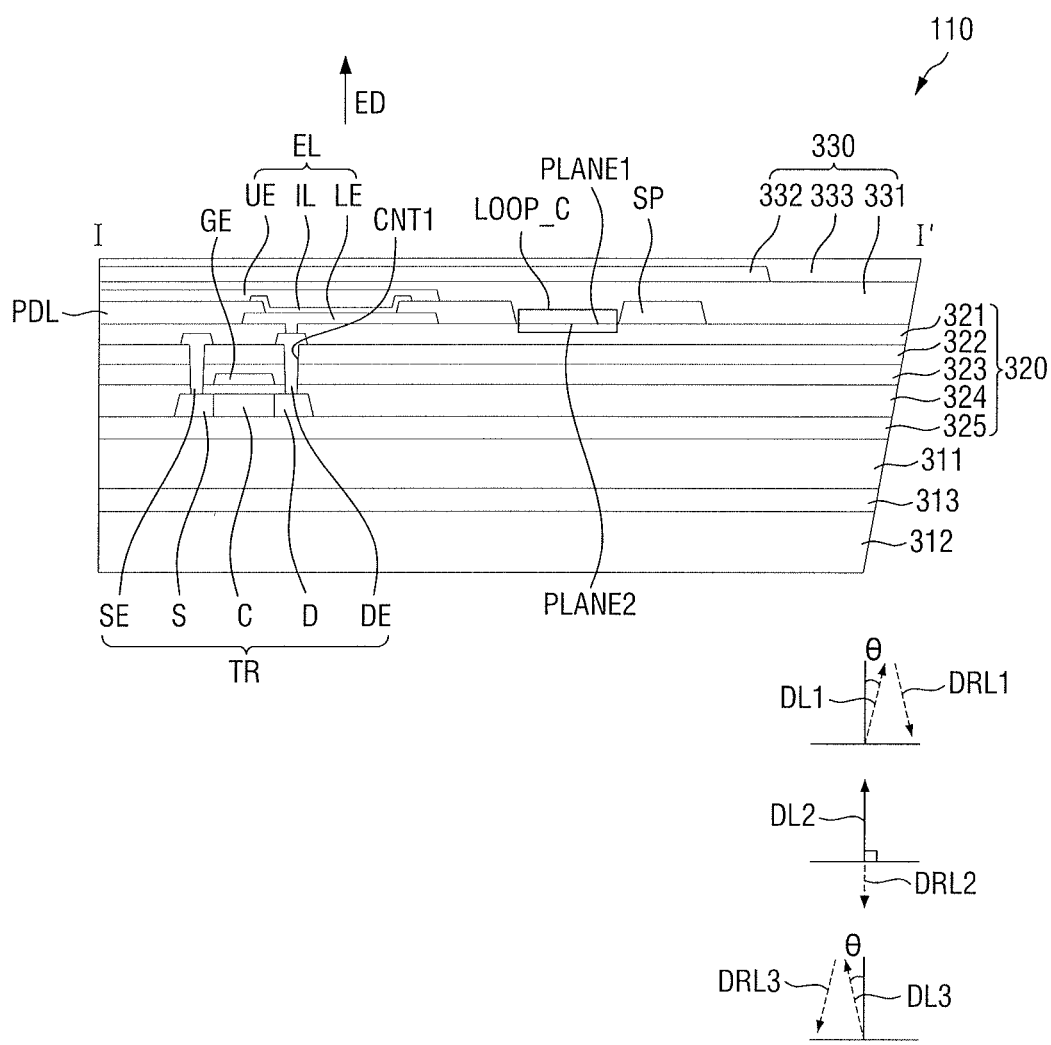

FIG. 2 illustrates a cross-sectional view taken along line I-I' of FIG. 1.

Referring to FIGS. 1 and 2, a preliminary flexible display module 110 may be prepared. The preliminary flexible display module 110 may become a flexible display module 510 by a subsequent laser cutting process.

The preliminary flexible display module 110 may have a substantially rectangular shape in a plan view. For example, the preliminary flexible display module 110 may have a substantially rectangular shape with rounded corners in a plan view. In some example embodiments, the preliminary flexible display module 110 may have a substantially rectangular shape with vertical corners.

Unless otherwise defined, the terms "upper portion" and "upper surface" in a thickness direction in the present specification refer to a display surface side that emits light based on the preliminary flexible display module 110 or the flexible display module 510 in the unfolded state and the terms "lower portion" and "lower surface" refer to an opposite side of the display surface based on the preliminary flexible display module 110 or the flexible display module 510 in the unfolded state. Further, "upper", "lower", "left", and "right" in a plane direction indicate a direction when the display surface is placed at a regular location and viewed from the top. In addition, "outside" indicates a direction toward the outside of the center of gravity of the foldable display device 100 and "inside" indicates a direction toward the center of gravity of the foldable display device 100. Herein, the term "display device" is a display part of an information device, such as a television and a mobile terminal for a final human consumer, as well as an optical device such as a luminaire.

The preliminary flexible display module 110 may comprise a flexible substrate including a flexible polymeric material such as polyimide or the like. As a result, the preliminary flexible display module 110 may be warpable, bendable, foldable, or rollable. Accordingly, the flexible display module 510 obtained by performing the laser cutting process on the preliminary flexible display module 110 may also be warpable, bendable, foldable, or rollable.

The preliminary flexible display module 110 may include a main region MR, a bendable region BR, and a sub region SR.

The main region MR may be a substantially flat region located on one plane. In some example embodiments, at least one edge of the main region MR other than an edge of the main region MR, which is connected to the bendable region BR, may be warped to form a curved surface or may be vertically bent.

The main region MR may be a display area DA including a plurality of electroluminescent units and a non-display area NDA surrounding the display area DA. The non-display area NDA may include an inorganic-inorganic contact closed loop LOOP_C, which surrounds the display area DA in a plan view. The display area DA may be located inside the inorganic-inorganic contact closed loop LOOP_C in a plan view.

The display area DA may have the substantially rectangular shape or the substantially rectangular shape with the rounded corners. In some example embodiments, the display area DA may have various shapes including a substantially square shape or other substantially polygonal shape, a substantially circular shape, a substantially elliptical shape, or the like.

The display area DA may be located at the at least one edge of the main region, which is warped to form the curved surface or which is vertically bent. Alternatively, the display area DA may not be located at the at least one edge of the main region, which is warped to form the curved surface or which is vertically bent.

As illustrated in FIG. 1, the bendable region BR may be connected to one side of the main region MR. For example, a left side of the bendable region BR may be connected to a right side of the main region MR.

The bendable region BR of the preliminary flexible display module 110 may be bent with a curvature such that the sub region SR may face a lower surface of the display area DA substantially opposite to an upper surface of the display area DA. A light is emitted from the upper surface of the display area DA. The bent bendable region BR will be described below with reference to FIG. 8.

The sub region SR may extend from the bendable region BR. The sub region SR may be in substantially parallel with the main region after bending the bendable region BR is completed. As described below, the sub region SR may overlap the main region MR in the thickness direction of the preliminary flexible display module 110 by bending the bendable region BR.

Wires may be located in the bendable region BR and the sub region SR. The wires in the bendable region BR may be connected to a circuit layer in the main region MR and may extend to the sub region SR. The sub region SR may include a pad PAD located in a pad portion P_PAD. The wires extending in the sub region SR may be connected to a circuit board 1060 described below via the pad PAD.

As illustrated in FIG. 2, the preliminary flexible display module 110 may include a plurality of organic films 311 to 313 and 332, inorganic films 321 to 325, 331, and 333, a transistor TR, and an organic electroluminescent unit EL.

A first organic flexible film 311 may be an insulating substrate. The first organic flexible film 311 may include a material such as a polymer material or the like. Examples of the polymeric material may include polyethersulfone (PES), polyacrylate (PA), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (CTA), cellulose acetate propionate (CAP), or a combination thereof.

A second organic flexible film 312 may be located under the first organic flexible film 311. The second organic flexible film 312 may support the first organic flexible film 311 and may include substantially the same material as the first organic flexible film 311. A double-sided adhesive film 313 may be interposed between the first organic flexible film 311 and the second organic flexible film 312. The second organic flexible film 312 may be attached to the first organic flexible film 311 by the double-sided adhesive film 313. The double-sided adhesive film 313 may be a film including an organic material. Examples of the film including the organic material may include an optically clear adhesive (OCA), a pressure sensitive adhesive (PSA) or the like. The first organic flexible film 311, the double-sided adhesive film 313, and the second organic flexible film 312 may constitute a flexible substrate of the preliminary flexible display module 110.

The entirety of the preliminary flexible display module 110 illustrated in FIG. 2 may be formed by integration processes in at least one chamber except for a lamination process for attaching the second organic flexible film 312 by using the double-sided adhesive film 313.

A fifth inorganic film 325 may be located on the first organic flexible film 311. Examples of the fifth inorganic film 325 may include a silicon oxide film, a silicon nitride film, a silicon oxynitride film, or a composite film thereof.

A semiconductor pattern having a source region S, a drain region D, and a channel region C located between the source region S and the drain region D may be located on the fifth inorganic film 325. The fifth inorganic film 325 may be located between the semiconductor pattern and the first organic flexible film 311 to increase adhesive force and to block moisture and oxygen that may be transferred from the first organic flexible film 311 to the semiconductor pattern. However, the fifth inorganic film 325 may be omitted depending on a type of first organic flexible film 311, process conditions, or the like. The source region S and the drain region D of the semiconductor pattern may be electrically connected to a source electrode SE and a drain electrode DE, respectively. The source electrode SE and the drain electrode DE will be described below.

A fourth inorganic film 324 may be located on the fifth inorganic film 325 to cover the semiconductor pattern. The fourth inorganic film 324 may function as a gate insulating layer. Examples of the fourth inorganic film 324 may include a silicon oxide film, a silicon nitride film, a silicon oxynitride film, or a composite film thereof.

A gate conductor including a gate electrode GE may be located on the fourth inorganic film 324. The gate electrode GE may overlap the semiconductor pattern. Examples of a conductive material included in the gate conductor may include aluminum (Al), silver (Ag), copper (Cu), molybdenum (Mo), chromium (Cr), titanium (Ti), tantalum (Ta), and alloys thereof.

A third inorganic film 323 may be located on the gate conductor including the gate electrode GE. Examples of the third inorganic film 323 may include a silicon oxide film, a silicon nitride film, a silicon oxynitride film, or a composite film thereof.

The second inorganic film 322 may be located on the third inorganic film 323. Examples of the second inorganic film 322 may include a silicon oxide film, a silicon nitride film, a silicon oxynitride film, or a composite film thereof.

A data conductor including the source electrode SE and the drain electrode DE may be located on the second inorganic film 322. The source electrode SE and the drain electrode DE may be located on the second inorganic film 322 to be spaced apart from each other. The data conductor may include at least one selected from the group of a metal, a metal alloy, a metal nitride, a conductive metal oxide, a transparent conductive material, and a combination thereof. The data conductor may be a single film or a multilayer film. The single film or the multilayer film may include nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), tantalum (Ta), and a combination thereof. An alloy formed by adding at least element selected from the group of zirconium (Zr), tungsten (W), niobium (Nb), platinum (Pt), hafnium (Hf), oxygen (O), and nitrogen (N) into a metal of at least one selected from the group of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), tantalum (Ta), and a combination thereof may be used to form the source electrode SE and the drain electrode DE.

The semiconductor pattern, the gate electrode GE, the source electrode SE, and the drain electrode DE may constitute a switching element. As illustrated In FIG. 2, the switching element may be a top gate typed transistor. Alternatively, the switching element may be a bottom gate typed transistor.

The first inorganic film may be located on the second inorganic film 322 to cover the data conductor. Examples of the first inorganic film 321 may include a silicon oxide film, a silicon nitride film, a silicon oxynitride film, or a composite film thereof. A first contact hole CNT1 through which at least a portion of the drain electrode DE is exposed may be formed through the second inorganic film 322, the third inorganic film 323, and the fourth inorganic film 324.

The first to fifth inorganic films 321 to 325 may constitute a lower encapsulation structure 320.

A lower electrode LE which is an individual electrode may be located on the first inorganic film 321. The lower electrode LE may be electrically connected to the drain electrode DE exposed through the first contact hole CNT1. The lower electrode LE may be an anode which is a hole injection electrode. The lower electrode LE may be a reflective electrode, a transflective electrode, or a transparent electrode. The lower electrode LE may include a reflective material.

The lower electrode LE may be a single film. Alternatively, the lower electrode LE may be a multilayer film in which two or more materials are stacked.

When the lower electrode LE is the multilayer film, the lower electrode LE may include a reflective conductive film and a transparent or translucent conductive film located on the reflective conductive film. Alternatively, the lower electrode LE may include a reflective conductive film and a transparent or translucent conductive film located under the reflective conductive film.

The transparent or translucent conductive film may include at least one selected from the group of indium tin oxide (ITO), indium zinc oxide (IZO), zinc oxide (ZnO), indium oxide (In2O3), indium gallium oxide (IGO), and a combination thereof.

A pixel defining layer PDL may be located on the lower electrode LE. The pixel defining layer PDL may include an opening through which at least a portion of the lower electrode LE is exposed. The pixel defining layer PDL may include an organic material or an inorganic material. The pixel defining layer PDL may include a material such as a photoresist, a polyimide resin, an acrylic resin, a silicon compound, a polyacrylic resin, or the like.

An intermediate layer IL may be located on the lower electrode LE and the pixel defining layer PDL. The intermediate layer IL may be located on at least a region exposed through the opening of the pixel defining layer PDL in the lower electrode LE. The intermediate layer IL may cover at least a portion of a side wall of the pixel defining layer PDL.

The intermediate layer IL may emit one color selected from the group of a red color, a blue color, and a green color. Alternatively, the intermediate layer IL may emit a white color or may emit one color selected from the group of cyan, magenta, and yellow. The intermediate layer IL may emit one color of red, blue, and green in one example embodiment. When the intermediate layer IL emits the white light, the intermediate layer IL may include an emitting material capable of emitting the white light. Alternatively, when the intermediate layer IL emits the white light, a red light emitting layer, a green light emitting layer, and a blue light emitting layer may be stacked in the thickness direction to form the intermediate layer IL.

An upper electrode UE may be located on the intermediate layer IL and the pixel defining layer PDL. The upper electrode UE may be a common electrode continuously formed on the intermediate layer IL and the pixel defining layer PDL. The upper electrode UE may be a cathode electrode. The upper electrode UE may be the transparent or translucent electrode.

The lower electrode LE, the intermediate layer IL, and the upper electrode UE may constitute an organic electroluminescent unit EL. The organic electroluminescent unit EL may further include a hole injection layer HIL, a hole transport layer HTL, an electron transport layer ETL, and an electron injection layer EIL.

An upper encapsulation multilayer film 330 may be located on the upper electrode UE. The upper encapsulation multilayer film 330 may prevent moisture and air that may be introduced from the outside from permeating into the organic electroluminescent unit EL. The upper encapsulation multilayer film 330 may include a sixth inorganic film 331, an organic film 332 and a seventh inorganic film 333.

The sixth inorganic film 331 may be located on the upper electrode UE. The sixth inorganic film 331 may include at least one selected from the group of silicon oxide (SiOx), silicon nitride (SiNx), and silicon oxynitride (SiONx).

The organic film 332 may be located on the sixth inorganic film 331. The organic film 332 may include one selected from the group of epoxy, acrylate, and urethane acrylate. The organic film 332 may flatten a step that may be formed by the pixel defining layer PDL.

The seventh inorganic film 333 may be located on the organic film 332. The seventh inorganic film 333 may include at least one selected from the group of silicon oxide (SiOx), silicon nitride (SiNx), and silicon oxynitride (SiONx).

In FIG. 2, the sixth inorganic film 331 and the seventh inorganic film 333 may each be a single layer. Alternatively, at least one selected from the group of the sixth inorganic film 331 and the seventh inorganic film 333 may be a multilayer film.

An inorganic-inorganic contact closed loop LOOP_C may be defined on an upper surface of the first inorganic film 321. As illustrated in FIG. 1, the inorganic-inorganic contact closed loop LOOP_C may be a closed loop extending along an outline of the preliminary flexible display module 110 in a plan view. The inorganic-inorganic contact closed loop LOOP_C may be a region in which an inorganic upper surface PLANE1 of the lower encapsulation structure 320 and an inorganic lower surface PLANE2 of the upper encapsulation multilayer film 330 directly contact each other. Penetration of oxygen or moisture between the first inorganic film 321 of the lower encapsulation structure 320 and the sixth inorganic film 331 of the upper encapsulation multilayer film 330 may be efficiently prevented by the inorganic-inorganic contact closed loop LOOP_C.

Referring back to FIG. 1, the preliminary flexible display module 110 may be obtained by laser cutting a base flexible display module (not illustrated) along a first path PATH1. The first path PATH1 may be a closed loop in a plan view. The first path PATH1 may extend outside the bendable region BR and the sub region SR in the vicinity of a first side E1 of the preliminary flexible display module 110. The first path PATH1 may be spaced apart from the inorganic-inorganic contact closed loop LOOP_C in the vicinity of a second side E2, a third side E3, and a fourth side E4. The inorganic-inorganic contact closed loop LOOP_C may be located inside a boundary defined by the first path PATH1 such that the first path PATH1 may not meet or contact the inorganic-inorganic contact closed loop LOOP_C.

A laser light used for the laser cutting may be irradiated in a first direction DL1 and/or a second direction DL2 among the first direction DL1, the second direction DL2, and a third direction DL3 illustrated in FIG. 2 toward the lower surface of the preliminary flexible display module 110.

As illustrated in FIG. 2, the first direction DL1 may form a specific angle θ toward the outside of the preliminary flexible display module 110 with respect to a light emission direction ED from the preliminary flexible display module 110. The specific angle θ may be in a range of from about 0.1 to about 5 degrees, in a range of from about 0.3 to about 3 degrees, or in a range of from about 0.5 to about 2 degrees.

The second direction DL2 may be in substantially parallel with the light emission direction ED from the preliminary flexible display module 110.

The third direction DL3 may form a specific angle θ toward the inside of the preliminary flexible display module 110 with respect to the light emission direction ED from the preliminary flexible display module 110.

If laser light directed toward the third direction DL3 were to be irradiated onto the lower surface of the preliminary flexible display module 110, the laser light might be reflected by the lower electrode LE or the upper electrode UE in a third reflection direction DRL3 and might enter the display area DA of the preliminary flexible display module 110 by repeated reflections. The organic material contained in the intermediate layer IL may be vulnerable to laser light. Accordingly, if reflected laser light were to be incident on the display area DA, serious damage to the display area DA of the preliminary flexible display module 110 could occur.

When the laser light directed in the first direction DL1 is irradiated onto the lower surface of the preliminary flexible display module 110, it might be possible that the laser light may be reflected in the first reflection direction DRL1 by a material having a reflection characteristic, such as the lower electrode LE or the upper electrode UE included in the preliminary flexible display module 110. However, unlike laser light reflected in a third reflection direction DRL3, laser light reflected in the first reflection direction DRL1 may be guided to the outside of the preliminary flexible display module 110. As a result, damage to the display area DA of the preliminary flexible display module 110 may be prevented or reduced.

When laser light directed toward the second direction DL2 is irradiated onto the lower surface of the preliminary flexible display module 110, a portion of the laser light may be reflected in a second reflection direction DRL2 by the lower electrode LE or the like. As a result, damage to the display area DA of the preliminary flexible display module 110 may be prevented or reduced.

Therefore, using laser light that may reduce a damage possibility of the display area DA by advancing in the first direction DL1 and/or the laser light that may reduce the damage possibility of the display area DA by advancing in the second direction DL2 may be advantageous compared with using laser light that may damage the display area DA by advancing in the third direction DL3. Furthermore, it is advantageous to use laser light that advances in the first direction DL1 because, in the second reflection direction DRL2, reflected laser light may enter a laser apparatus to damage a lens included in the laser apparatus.

Laser light advancing in the first direction DL1 and/or laser light advancing in the second direction DL2 may be used during laser cutting of the preliminary flexible display module 110. As a result, a laser etching surface of a side portion of the preliminary flexible display module 110 may have a reverse tilted structure.

The reverse tilted structure may be formed not only in the case of using laser light advancing in the first direction DL1 but also in the case of using laser light advancing in the second direction DL2. The reason is that in the case of using the laser light advancing in the second direction DL2, a portion of the preliminary flexible display module 110 relatively close to the laser apparatus receives a relatively greater amount of energy than a portion of the preliminary flexible display module 110 that is substantially farther from the laser apparatus.

When laser light directed in the first direction DL1 is used for laser cutting, the side surface of the preliminary flexible display module 110 may have an inner angle of about 3 to about 5 degrees with respect to the light emission direction ED. In example embodiments, when laser light directed in the second direction DL2 is used for laser cutting, the side surface of the preliminary flexible display module 110 may have an inner angle of about 1 to about 3 degrees with respect to the light emission direction ED.

As described with reference to FIGS. 1 and 2, the preliminary flexible display module 110 may be used for manufacturing the foldable display device 100. The preliminary flexible display module 110 may be obtained by cutting the base flexible display module (not illustrated) along the first path PATH1 by using the laser light irradiated in the first direction DL1 and/or in the second direction DL2. The damage to the display area DA of the preliminary flexible display module 110 during laser cutting may be prevented. Further, the first path PATH1 may be substantially larger than the inorganic-inorganic contact closed loop LOOP_C and may not contact the inorganic-inorganic contact closed loop LOOP_C. In this regard, if the first path PATH1 were to contact the inorganic-inorganic contact closed loop LOOP_C, the inorganic-inorganic contact closed loop LOOP_C could be damaged by the laser light, and as a result, moisture or oxygen could easily penetrate through the inorganic-inorganic contact closed loop LOOP_C.

Figure 3:
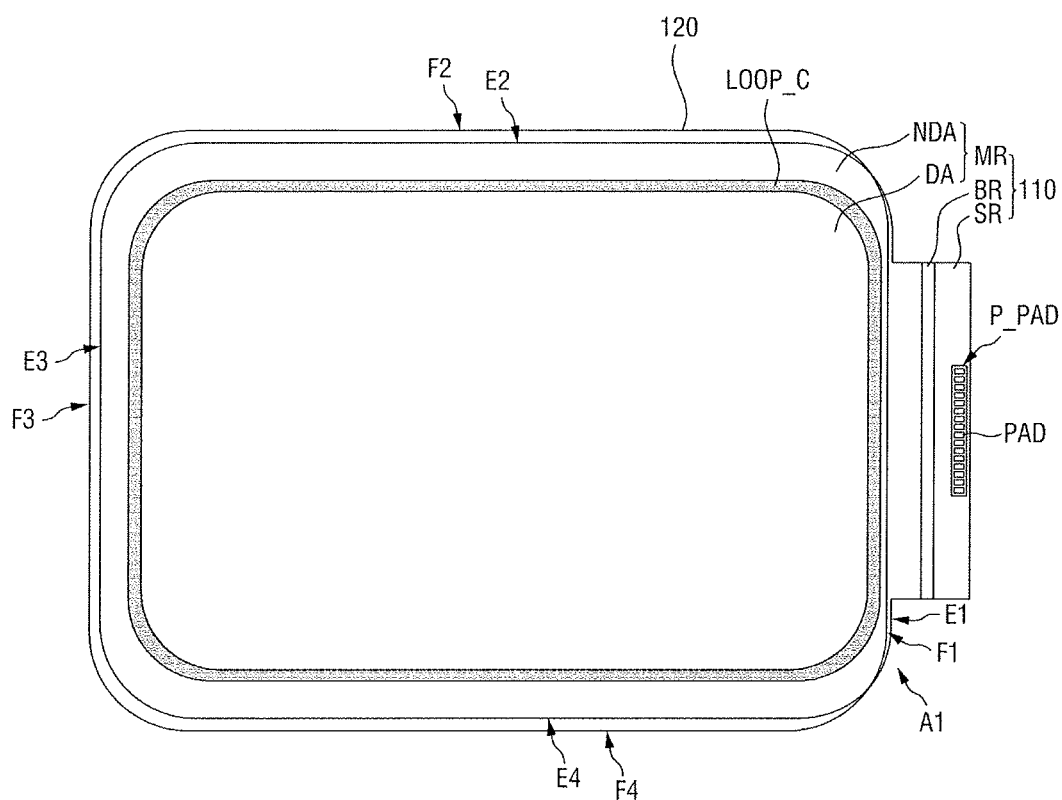

Referring to FIG. 3, a preliminary flexible functional module 120 may be located on the preliminary flexible display module 110. The preliminary flexible functional module 120 may be located to overlap the preliminary flexible display module 110.

Figure 7:
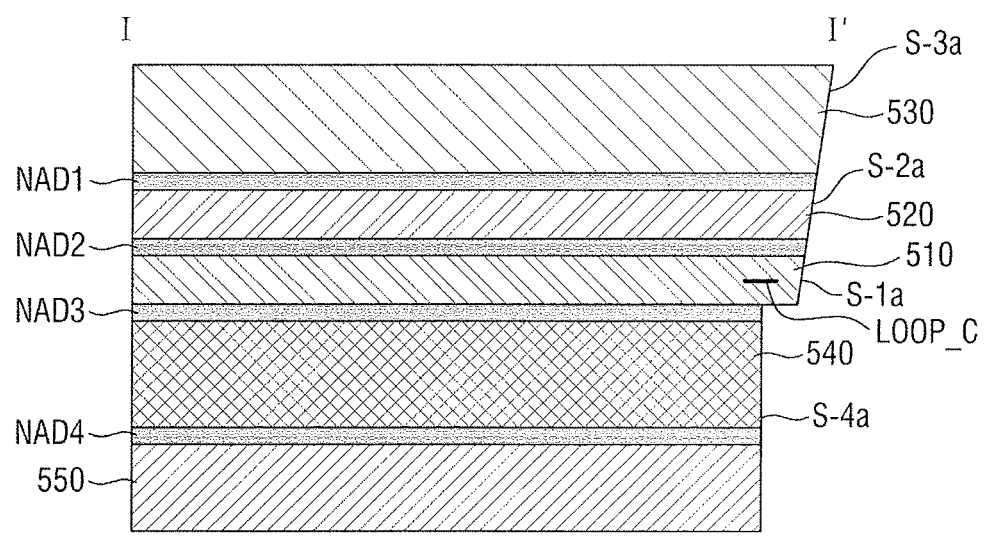

A second upper double-sided adhesive film NAD2 illustrated in FIG. 7 may be interposed between the preliminary flexible functional module 120 and the preliminary flexible display module 110. The second upper double-sided adhesive film NAD2 may be a film having adhesive properties on both the upper and lower surfaces. For example, the second upper double-sided adhesive film NAD2 may be an optically clear adhesive (OCA) or a press sensitive adhesive (PSA). The preliminary flexible functional module 120 may be attached to the preliminary flexible display module 110 by the second upper double-sided adhesive film NAD2.

The preliminary flexible functional module 120 may include at least one functional layer. The functional layer may be a layer that performs a touch sensing function, a color filtering function, a color conversion function, polarization, a biometric information recognition function, or the like. An example of the biometric information recognition function may include a fingerprint recognition function. The functional layer may be a sheet layer, a film layer, a thin-film layer, a coating layer, a panel, a plate, or the like. The functional layer may be constituted by a single layer. In example embodiments, a functional layer may include a plurality of laminated thin films or coating layers. For example, the functional layer may be a touch sensing panel, a color filter, an optical film, a fingerprint sensing panel, or the like.

The preliminary flexible functional module 120 may include an optical film such as a micro-lens or a prism film. However, if desired, the optical film may be omitted.

Similar to the main region MR of the preliminary flexible display module 110, the preliminary flexible functional module 120 may have a substantially rectangular shape in a plan view or a substantially rectangular shape with rounded corners. The preliminary flexible functional module 120 may have an area that is substantially larger than an area of the preliminary flexible display module 110.

A first side F1 of the preliminary flexible functional module 120 may be located inside the first side E1 of the preliminary flexible display module 110 in a plan view. For example, the first side F1 of the preliminary flexible functional module 120 may be located substantially closer toward the center of the area of preliminary flexible display module 110 than the first side E1 of the preliminary flexible display module 110 in a plan view. In a first area A1, a portion of the main region MR of the preliminary flexible display module 110 may be exposed by the preliminary flexible functional module 120.

A second side F2, a third side F3, and a fourth side F4 of the preliminary flexible functional module 120 may be located outside the second side E2, the third side E3, and the fourth side E4 of the preliminary flexible display module 110, respectively. For example, the preliminary flexible functional module 120 may cover the preliminary flexible display module 110 in upper, left, and lower directions.

The preliminary flexible functional module 120 may overlap the inorganic-inorganic contact closed loop LOOP_C of the preliminary flexible display module 110. For example, the preliminary flexible functional module 120 may completely cover the inorganic-inorganic contact closed loop LOOP_C of the preliminary flexible display module 110.

In FIG. 3, the first side F1 of the preliminary flexible functional module 120 may be located inside the first side E1 of the preliminary flexible display module 110 in a plan view. Alternatively, the first side F1 of the preliminary flexible functional module 120 may be located outside the first side E1 of the preliminary flexible display module 110 such that the preliminary flexible functional module 120 may completely cover the main region MR of the preliminary flexible display module 110.

Figure 4:
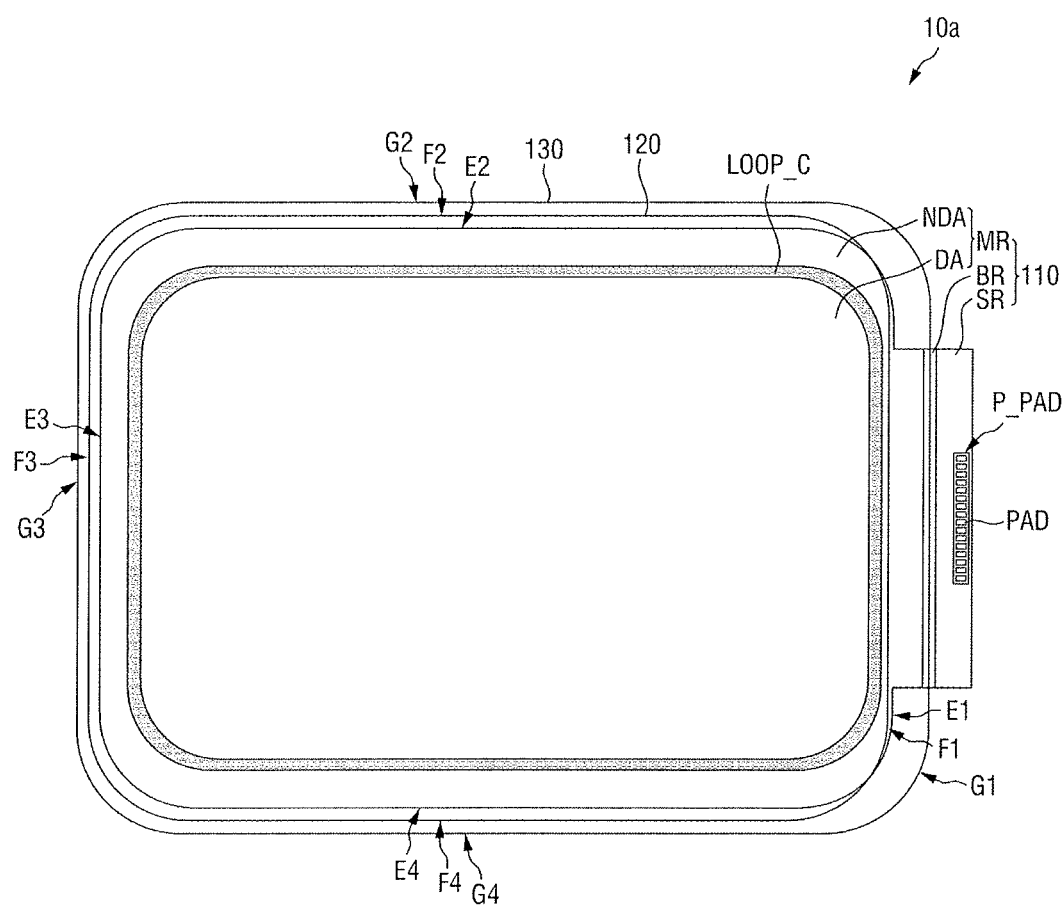

Referring to FIG. 4, a preliminary flexible window module 130 may be located on the preliminary flexible functional module 120. Accordingly, a preliminary upper structure 10a including the preliminary flexible display module 110, the preliminary flexible functional module 120, and the preliminary flexible window module 130 may be formed. The preliminary flexible window module 130 may be located to overlap the preliminary flexible functional module 120 and the preliminary flexible display module 110.

A first upper double-sided adhesive film NAD1 illustrated in FIG. 7 may be interposed between the preliminary flexible window module 130 and the preliminary flexible functional module 120. The first upper double-sided adhesive film NAD1 may be a film having the adhesive properties on both the upper and lower surfaces similarly to the second upper double-sided adhesive film NAD2. The preliminary flexible window module 130 may be attached to the preliminary flexible functional module 120 by the first upper double-sided adhesive film NAD1.

The preliminary flexible window module 130 may cover the main region MR to protect the main region MR. The preliminary flexible window module 130 may include the transparent material. The preliminary flexible window module 130 may include plastic. In this case, the preliminary flexible window module may have a flexible property.

Examples of the plastic included in the preliminary flexible window module 130 may include polyimide, polyacrylate, polymethylmethacrylate (PMMA), polycarbonate (PC), polyethylenenaphthalate (PEN), polyvinylidene chloride, polyvinylidene difluoride (PVDF), polystyrene, ethylene vinylalcohol copolymer, polyethersulfone (PES), polyetherimide (PEI), polyphenylene sulfide (PPS), triacetyl cellulose (TAC), cellulose acetate propionate (CAP), or the like. The preliminary flexible window module 130 may include one or more of the plastic materials listed above.

Similar to the main region MR of the preliminary flexible display module 110, the preliminary flexible window module 130 may have a substantially rectangular shape in a plan view or a substantially rectangular shape with the rounded corners. The preliminary flexible window module 130 may have an area that is substantially larger than the area of the preliminary flexible functional module 120.

A first side G1, a second side G2, a third side G3, and a fourth side G4 of the preliminary flexible window module 130 may be located outside the first side F1, the second side F2, the third side F3, and the fourth side F4 of the preliminary flexible functional module 120, respectively. The preliminary flexible window module 130 may completely cover the preliminary flexible functional module 120.

The first side G1 of the preliminary flexible window module 130 may overlap the bendable region BR of the preliminary flexible display module 110 in a plan view. For example, the first side G1 of the preliminary flexible window module 130 may coincide with a bending line that horizontally bisects the bendable region BR of the preliminary flexible display module 110 in a plan view. The first side G1 of the preliminary flexible window module 130 may pass through the center of the bendable region BR of the preliminary flexible display module 110 such that the preliminary flexible window module 130 may cover approximately a half of the bendable region BR of the preliminary flexible display module 110.

Figure 5:
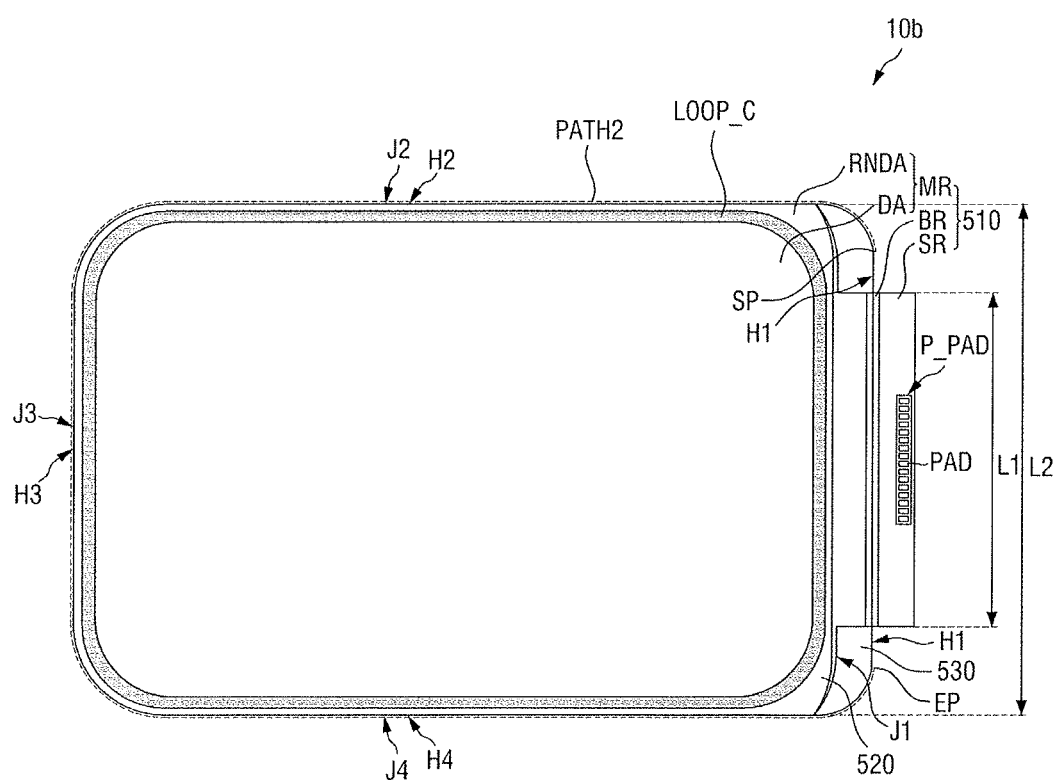

Referring to FIG. 5, an upper structure 10b including the flexible display module 510, a flexible functional module 520, and a flexible window module 530 may be formed by laser cutting the preliminary upper structure 10a including the preliminary flexible display module 110, the preliminary flexible functional module 120, and the preliminary flexible window module 130 along the second path PATH2. In the laser cutting, a laser process condition may be adjusted such that the irradiation direction may be in the first direction DL1 and/or the second direction DL2 described with reference to FIG. 2. A laser type, energy, an irradiation angle, and the like may be changed in the process of adjusting the laser process condition.

As illustrated in FIG. 7, the preliminary flexible display module 110, the preliminary flexible functional module 120, and the preliminary flexible window module 130 may become the flexible display module 510, the flexible functional module 520, and the flexible window module 530, respectively, by the laser cutting along the second path PATH2.

The flexible display module 510, the flexible functional module 520, and the flexible window module 530 may be substantially the same as the preliminary flexible display module 110, the preliminary flexible functional module 120, and the preliminary flexible window module 130, respectively, except for their shapes. Accordingly, a redundant description will not be repeated.

A portion of the non-display area NDA included in the main region MR of the preliminary flexible display module 110 may be removed by the laser cutting along the second path PATH2. Accordingly, the non-display area NDA may become a reduced non-display area RNDA. Signal wires or driving circuits for applying a signal to the display area DA may be located in the reduced non-display area RNDA. In addition, an outermost black matrix may be located in the reduced non-display area RNDA.

In example embodiments, an extension length L1 of the bendable region BR may be substantially less than a length L2 of one side of the main region MR adjacent to the bendable region BR.

Although the flexible display module 510 has been described to include an organic electroluminescent unit, any suitable type of light emitting unit may be applied as long as an image may be displayed by an input data signal. For example, the flexible display module 510 may be a liquid crystal flexible display module, a plasma flexible display module, an electrophoretic flexible display module, an electro-wettable flexible display module, a quantum dot light emitting flexible display module, a micro light emitting diode (Micro LED), or the like.

The second path PATH2 may be an opened loop in a plan view. For example, a start point SP and an end point EP of the second path PATH2 may not coincide with each other. As illustrated in FIG. 5, the start point SP of the second path PATH2 may be located in the vicinity of a corner where the first side H1 and the second side H2 of the upper structure 10b meet. The end point EP of the second path PATH2 may be located at a corner where the first side H1 and the fourth side H4 of the upper structure 10b meet.

The second path PATH2 may be spaced apart from the inorganic-inorganic contact closed loop LOOP_C by a predetermined interval. For example, the inorganic-inorganic contact closed loop LOOP_C may be located inside the second path PATH2. The second path PATH2 may not meet or may not contact the inorganic-inorganic contact closed loop LOOP_C. If the second path PATH2 were to contact the inorganic-inorganic contact closed loop LOOP_C, the inorganic-inorganic contact closed loop LOOP_C could be damaged during laser cutting, and moisture or oxygen could penetrate through the inorganic-inorganic contact closed loop LOOP_C.

An irradiation angle of laser light irradiated along the second path PATH2 for cutting the preliminary upper structure 10a may be substantially different from the irradiation angle of laser light irradiated along the first path PATH1 for cutting of the base flexible display module. For example, the laser light irradiated in the second direction DL2 may be used during laser cutting of the base flexible display module and the laser light irradiated in the first direction DL1 may be used during laser cutting of the preliminary upper structure 10a.

In this case, a first side J1 of the flexible display module 510 may have a side surface having an inclination angle corresponding to the second direction DL2. A second side J2, a third side J3, and a fourth side J4 of the flexible display module 510 may have side surfaces having an inclination angle corresponding to the first direction DL1. For example, the inclination angle of the laser etching surface on the first side J1 of the flexible display module 510 and the inclination angle of the laser etching surface at the second side J2, the third side J3, and the fourth side J4 may be substantially different from each other.

The second path PATH2 may be opened to the first side H1 of the upper structure 10b. Accordingly, the laser etching surface may be formed only on the second to fourth sides H2, H3, and H4 of the upper structure 10b.

According to an example embodiment, laser light irradiated to the base flexible display module along the first path PATH1 of FIG. 1 may be a first pulse width laser light having a first pulse duration. The laser light irradiated to the preliminary upper structure 10a along the second path PATH2 of FIG. 5 may be a second pulse width laser light having a second pulse duration substantially shorter than the first pulse duration. A thickness of the preliminary upper structure 10a is substantially larger than the thickness of the base flexible display module. Accordingly, when the pulse width of laser light irradiated to the preliminary upper structure 10a is relatively long, undesired results may occur. Examples of the undesired results may include thermal damages to the preliminary upper structure 10a, molten materials generated on the periphery of a cut surface, and contaminants such as carbonized foreign matters generated from the preliminary upper structure 10a. Thus, to reduce the undesired results, it is desired that the second pulse duration is substantially shorter than the first pulse duration. As an example, when the first pulse width laser is a nanosecond pulse laser, the second pulse width laser light may be laser light having a pulse duration substantially smaller than about 1 nanosecond, such as a picosecond pulse laser or a femtosecond pulse laser. As another example, when the first pulse width laser is the picosecond pulse laser, the second pulse width laser light may be femtosecond pulse laser light.

According to an example embodiment, both the laser light irradiated to the base flexible display module along the first path PATH1 of FIG. 1 and the laser light irradiated to the preliminary upper structure 10a along the second path PATH2 of FIG. 5 may be nanosecond pulse laser light. In this case, it may be desirable to discharge contaminants such as carbonized foreign matters that may be generated in a large amount at the time of irradiating the laser light to the preliminary upper structure 10a, which is relatively thick, to the outside using an ejector provided in a chamber.

According to an example embodiment, both the laser light irradiated to the base flexible display module along the first path PATH1 of FIG. 1 and the laser light irradiated to the preliminary upper structure 10a along the second path PATH2 of FIG. 5 may be picosecond pulse laser light. In this case, the amount of the contaminants such as the carbonized foreign matters that may be generated at the time of irradiating the laser to the preliminary upper structure 10a, which is relatively thick, may be reduced as compared with the amount in the case of using nanosecond pulse laser light.

According to an example embodiment, both the laser light irradiated to the base flexible display module along the first path PATH1 of FIG. 1 and the laser light irradiated to the preliminary upper structure 10a along the second path PATH2 of FIG. 5 may be femtosecond pulse laser light. In this case, the amount of the contaminants such as the carbonized foreign matters that may be generated at the time of irradiating the laser to the preliminary upper structure 10a, which is relatively thick, may be reduced as compared with the amount in the case of using nanosecond pulse laser light.

Figure 6:
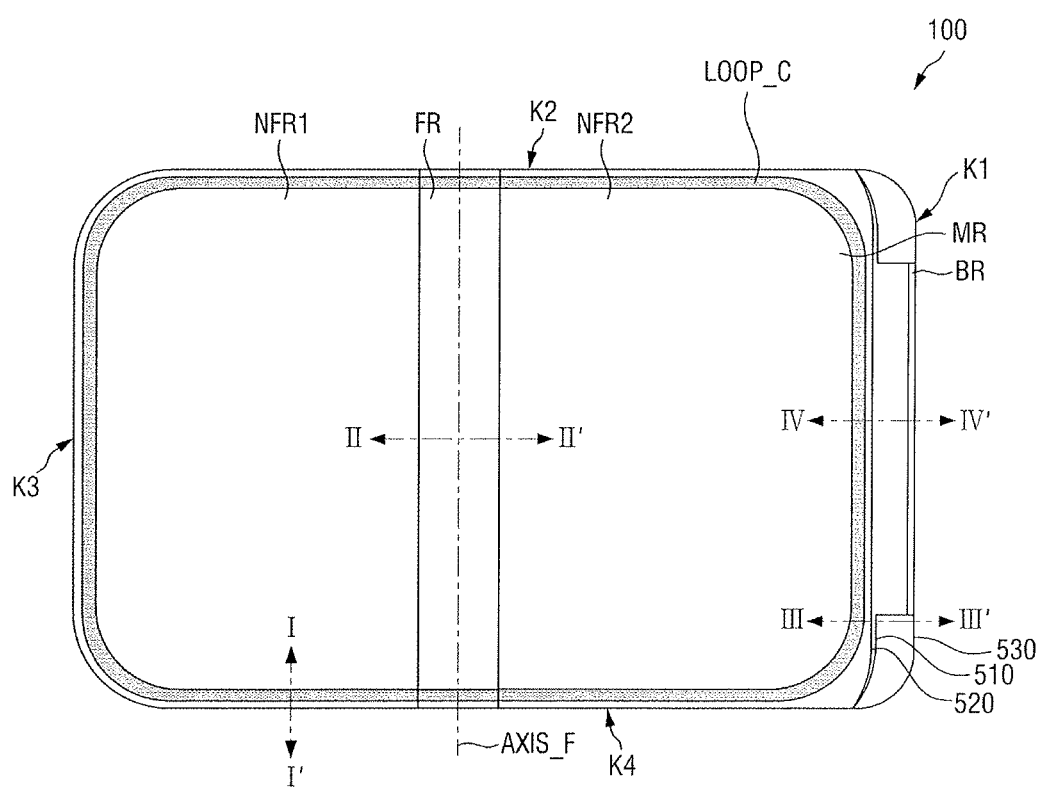
Figure 8:
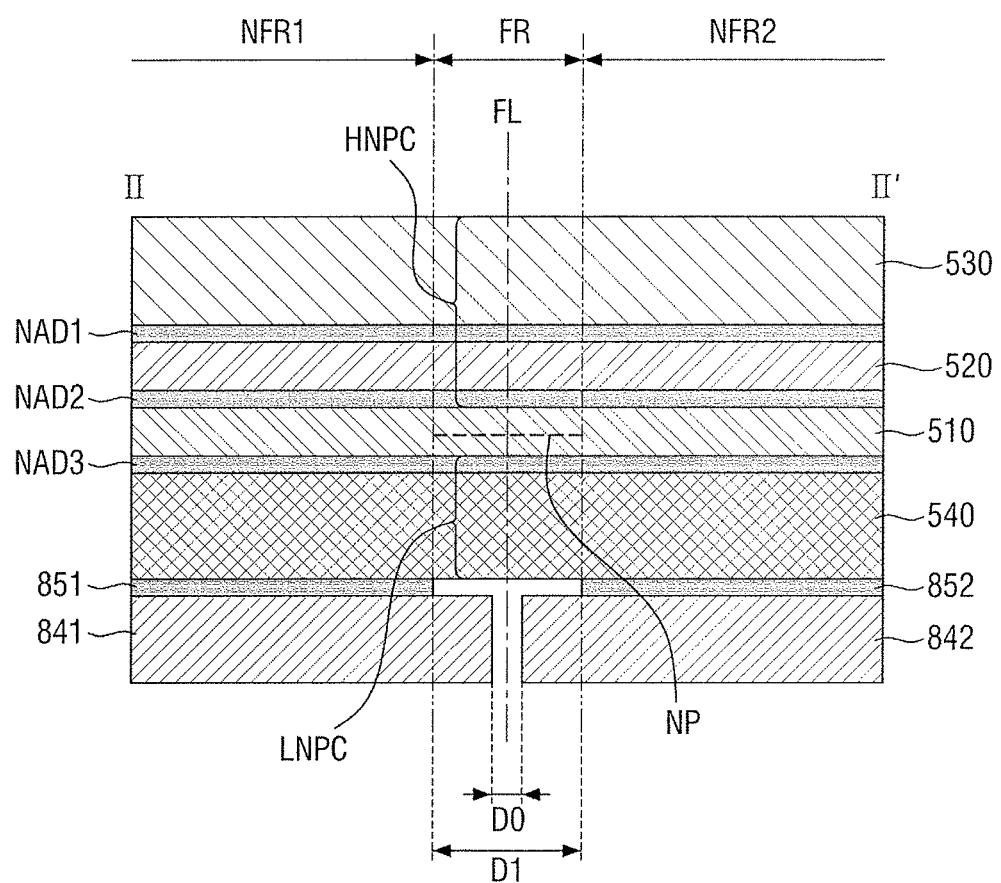
Figure 9:
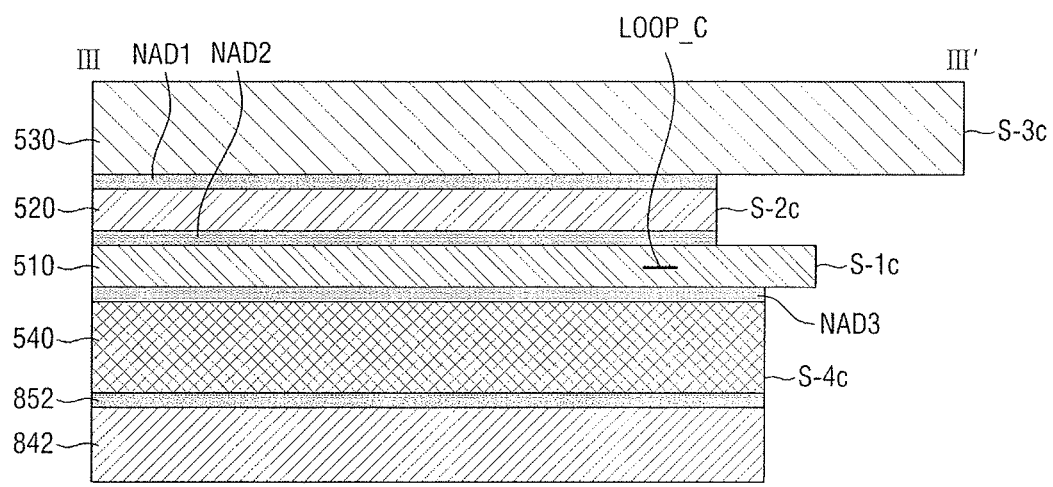
Figure 10:
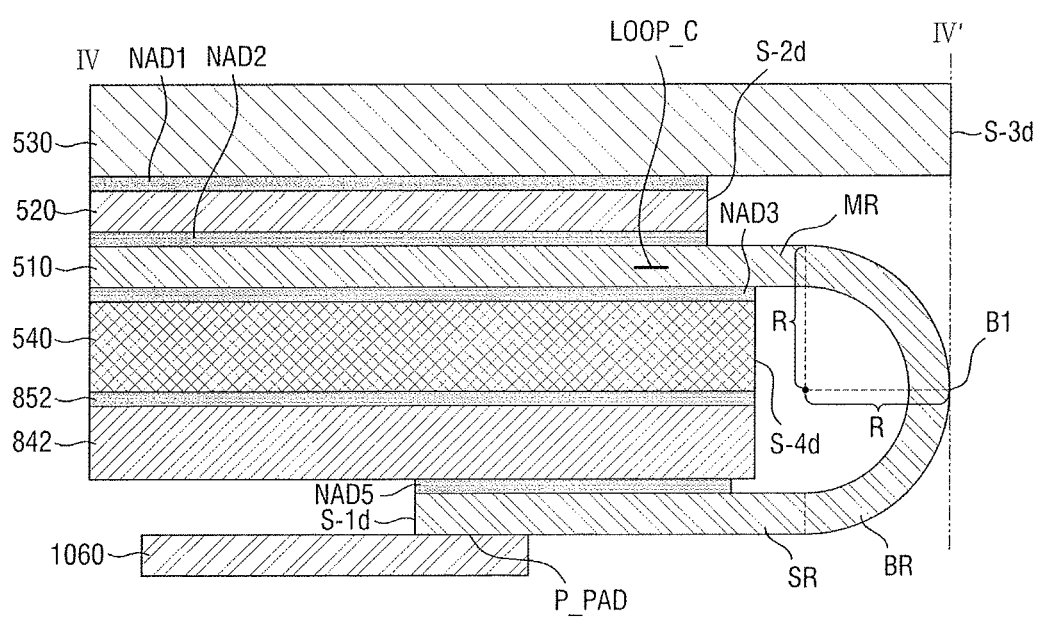

FIG. 7 illustrates a cross-sectional view taken along line I-I of FIG. 6. FIG. 8 illustrates a cross-sectional view taken along line II-II of FIG. 6. FIG. 9 illustrates a cross-sectional view taken along line of FIG. 6. FIG. 10 illustrates a cross-sectional view taken along line IV-IV' of FIG. 6.

Referring to FIGS. 6 to 10, a lower flexible module 540 and a rigid film 550 may be attached to a lower portion of the upper structure 10b. Subsequently, the sub region SR may be attached to the lower portion of the rigid film 550 by bending the bendable region BR at the lower portion of the rigid film 550 to complete the foldable display device 100.

As illustrated in FIG. 6, the foldable display device 100 may include a foldable region FR. The foldable region FR will be described below together with the rigid film 550.

The foldable display device 100 may be bent based on a folding axis AXIS_F. Here, the folding axis AXIS_F may cross a second side K2 and a fourth side K4 of the foldable display device 100 not adjacent to the bendable region BR of the flexible display module 510. The foldable display device 100 may be capable of being switched between a folded state and an unfolded state based on the folding axis AXIS_F.

Herein, the term "foldable" should be construed as including all of partial folding, full folding, rollable, in-folding, out-folding, and flexibility. The foldable region FR will be described below with reference to FIG. 8 after describing the lower flexible module 540 and the rigid film 550.

The lower flexible module 540 may overlap the flexible display module 510 in the thickness direction. For example, the lower flexible module 540 may be located under the flexible display module 510.

The lower flexible module 540 may include at least one functional layer. The functional layer may be a layer performing a heat dissipation function, an electromagnetic wave shielding function, a grounding function, a buffering function, a strength enhancement function, a support function, a bonding function, a pressure sensing function, a digitizing function, or the like. The functional layer may be a support substrate, a heat dissipation layer, an electromagnetic wave shielding layer, an impact absorbing layer, a bonding layer, a pressure sensor, a digitizer, or the like. When the lower flexible module 540 includes the impact absorbing layer, the lower flexible module 540 may be referred to as a cushion module.

The lower flexible module 540 may have lower light transmittance than the flexible window module 530. For example, the flexible window module 530 may have relatively high light transmittance and transmit the light emitted from the display area DA of the flexible display module 510 upward. The lower flexible module 540 may have a relatively low transmittance and may block the light which is emitted from the display area and, then, reflected in the flexible display module 510 toward the lower flexible module 540.

A third lower double-sided adhesive film NAD3 may be located between the lower flexible module 540 and the flexible display module 510. The lower flexible module 540 may be attached to the lower surface of the flexible display module 510 by the third lower double-sided adhesive film NAD3. The third lower double-sided adhesive film NAD3 may be a film having the adhesive properties to both the upper and lower surfaces, similarly to the first and second upper double-sided adhesive films NAD1 and NAD2. The third lower double-sided adhesive film NAD3 may be the press sensitive adhesive (PSA).

The lower flexible module 540 may include an impact absorbing layer. The impact absorbing layer may prevent impact applied from the outside from being transferred to the flexible display module 510 from the bottom. For example, the impact absorbing layer may include polyurethane (PU), thermoplastic polyurethane (TPU), silicone (Si), polydimethylacrylamide (PDMA), or the like.

The rigid film 550 may overlap the lower flexible module 540 in the thickness direction and may be located below the lower flexible module 540.

The rigid film 550 may include a metal material such as stainless steel (SUS), aluminum or the like. Alternatively, the rigid film 550 may include a polymer such as polymethyl methacrylate (PMMA), polycarbonate (PC), polyvinylalcohol (PVA), acrylonitrile-butadiene-styrene (ABS), polyethylene terephthalate (PET), or the like. The rigid film 550 may prevent the flexible display module 510 from being bent by external force or may alleviate or reduce the degree of bending (e.g., the bending angle and the bending radius of curvature) of the flexible display module 510. For example, the rigid film 550 may maintain the flexible display module 510 in a relatively flat state even when an external force is applied. The rigid film 550 may be rigid or semi-rigid. For example, the rigid film 550 may be a stainless steel film having a thickness of about 150 μm to about 200 μm. In example embodiments, the rigid film 550 may be an aluminum film having a thickness of about 150 μm to about 200 μm.

A fourth lower double-sided adhesive film NAD4 may be located between the rigid film 550 and the lower flexible module 540. The rigid film 550 may be attached to the lower flexible module 540 by the fourth lower double-sided adhesive film NAD4.

A protrusion, a groove or a hole may be formed on the lower surface of the rigid film 550. A foldable mobile may include a housing case to which the foldable display device 100 is coupled. The housing case may be coupled to the rigid film 550 by the protrusion, the groove, or the hole such that the foldable display device 100 may be coupled to the housing case.

As illustrated in FIG. 7, at the fourth side K4 of the foldable display device 100, a side surface S-1a of the flexible display module 510, a side surface S-2a of the flexible functional module 520, and a side surface S-3a of the flexible window module 530 may be located on a first plane.

An inner angle formed by the upper surface of the flexible window module 530 and the first plane may be an acute angle. For example, the acute angle may range from about 85 degrees to about 89 degrees or from about 85 degrees to about 87 degrees.

At the fourth side K4 of the foldable display device 100, a side surface S-4a of the lower flexible module 540 may be located on a second plane. The second plane may be located to be substantially closer to the center of gravity of the foldable display device 100 than the first plane. The second plane may be substantially non-parallel with the first plane. For example, the second plane may be substantially perpendicular to the display surface of the flexible display module 510.

A side profile of the fourth side K4 of the foldable display device 100 may be substantially similar to the side profile of the second side K2 and the third side K3. Accordingly, descriptions of the side profiles of the second side K2 and the third side K3 will not be repeated.

As illustrated in FIG. 8, the rigid film 550 may include a first plate 841 (e.g., a first portion) and a second plate 842 (e.g., a second portion) that are laterally separated from each other. The first plate 841 and the second plate 842 may be located on substantially the same plane and may be horizontally spaced apart from each other by a reference separation distance D0. A reference separation distance D0 may be about 0.1 mm or less. The first and second plates 841 and 842 may be mutually symmetric with respect to a folding line FL (e.g., a line meeting the folding axis AXIS_F in the thickness direction). Alternatively, the first and second plates 841 and 842 may be mutually asymmetric with respect to the folding line FL.

In FIG. 8, the first plate 841 and the second plate 842 may be spaced apart from each other. Alternatively, at least a portion of an inner surface of the first plate 841 may contact an inner surface of the second plate 842.

According to an example embodiment, the first plate 841 and the second plate 842 may have a shape in which the thickness thereof decreases in a direction toward the folding line FL. The thicknesses of the first plate 841 and the second plate 842 may be reduced stepwise. Alternatively, the thicknesses of the first plate 841 and the second plate 842 may be continuously reduced. When the first plate 841 and the second plate 842 have a shape in which the thickness is reduced toward the folding line FL, portions of the first plate 841 and the second plate 842, the portions being near the folding line FL, may have substantially higher flexibilities than other portions the first plate 841 and the second plate 842.

The fourth lower double-sided adhesive film NAD4 may include a first double-sided adhesive film 851 (e.g., a third portion) and a second double-sided adhesive film 852 (e.g., a fourth portion) which may be separated from each other.

The first double-sided adhesive film 851 may overlap the flexible display module 510 (e.g., the lower flexible module 540) in the thickness direction in a first non-foldable region NFR1 and may be located between the lower flexible module 540 and the first plate 841. The first plate 841 may be coupled to the lower flexible module 540 by the first double-sided adhesive film 851. Similarly, the second double-sided adhesive film 852 may overlap the flexible display module 510 (e.g., the lower flexible module 540) in a second non-foldable region NFR2 and may be located between the lower flexible module 540 and the second plate 842. The second plate 842 may be coupled to the lower flexible module 540 by the second double-sided adhesive film 852.

The first double-sided adhesive film 851 and the second double-sided adhesive film 852 may be located on substantially the same plane and may be horizontally spaced apart from each other by a first separation distance D1. The first separation distance D1 may be substantially greater than the reference separation distance D0. The first separation distance D1 may be about 10 mm or less or about 7.5 mm or less. The first double-sided adhesive film 851 and the second double-sided adhesive film 852 may be horizontally symmetrical with respect to the folding axis AXIS_F (e.g., a folding line or a folding face formed by extending the folding axis in the thickness direction).

The inner surface of the first plate 841 may be closer to the folding line FL than the inner surface of the first double-sided adhesive film 851. The inner surface of the second plate 842 may be closer to the folding line FL of the inner surface than the second double-sided adhesive film 852.

The foldable region FR and the first and second non-foldable regions NFR1 and NFR2 of the flexible display module 510 may be set or defined by the first double-sided adhesive film 851 and the second double-sided adhesive film 852. The foldable region FR and the first and second non-foldable regions NFR1 and NFR2 of foldable display device 100 may be set or defined by the first double-sided adhesive film 851 and the second double-sided adhesive film 852. The first and second non-foldable regions NFR1 and NFR2 may be regions where the first and second plates 841 and 842 are coupled to the lower flexible module 540 by the first and second double-sided adhesive films 851 and 852, respectively. The first and second non-foldable regions NFR1 and NFR2 may have a substantially small degree of bending due to the external force and may have a generally flat state. For example, the first and second non-foldable regions NFR1 and NFR2 may be defined as regions where the rigid film 550 (e.g., the first and second plates 841 and 842), the fourth lower double-sided adhesive film NAD4 (e.g., the first and second double-sided adhesive films 851 and 852), and the flexible display module 510 simultaneously overlap each other and are coupled (e.g., attached) to each other in the thickness direction. The foldable region FR may be a region that is not directly coupled with (e.g., not supported by) the first plate 841 and the second plate 842. The foldable region FR may have a substantially large degree of bendability in response to an external force. For example, with respect to the same external force, the degree of deformation (e.g., the degree of bending) of the foldable region FR may be about three times or more the degree of deformation of the first and second non-foldable regions NFR1 and NFR2. The foldable region FR may be switched from the folded state to the unfolded state by the external force or may be switched from the unfolded state to the folded state by the external force.

As illustrated in FIG. 6, the foldable region FR may have a substantially rectangular shape and may have a specific width to the left and to the right with respect to the folding axis AXIS_F extending up and down (e.g., in the vertical direction). The foldable region may extend up and down from an upper side to a lower side. The width of the foldable region FR may be substantially the same as or substantially similar to the first separation distance D1 between the first and second double-sided adhesive films 851 and 852.

The first non-foldable region NFR1 may be connected to one side (e.g., the left side with respect to the folding axis AXIS_F) of the foldable region FR and the second non-foldable region NFR2 may be connected to the other side (e.g., the right side with respect to the folding axis AXIS_F) of the foldable region FR. The width of the first non-foldable region NFR1 may be substantially equal to or substantially different from the width of the second non-foldable region NFR2.

A neutral plane NP of the foldable display device 100 may be matched to the flexible display module 510 of the flexible display module 510. For example, the neutral plane NP of the foldable display device 100 may be matched to a drive transistor TR of the flexible display module 510.

When the foldable display device 100 is bent or folded, a tensile stress may be generated on one surface of the foldable display device 100 and a compressive stress may be generated on the other surface of the foldable display device 100. In the middle, there may be a plane that is neither expanded nor contracted, which is defined as the neutral plane NP. There is substantially no bending stress on the neutral plane NP. For example, a higher neutral plane control unit HNPC and a lower neutral plane control unit LNPC may be used to place the neutral plane NP of the foldable display device 100 in the flexible display module 510. For example, the higher neutral plane control unit HNPC and the lower neutral plane control unit LNPC may place the neutral plane NP of the foldable display device 100 in a layer in which the drive transistor of the flexible display module 510 is located.

As described above, the foldable region FR of the foldable display device 100 may be defined by the first and second double-sided adhesive films 851 and 852 and the neutral plane NP may be placed in the flexible display module 510 by the higher neutral plane control unit HNPC and the lower neutral plane control unit LNPC.

As illustrated in FIG. 9, in a corner region (e.g., the first area A1) where the first and fourth sides K1 and K4 of the foldable display device 100 meet, a side surface S-1c of the flexible display module 510, a side surface S-2c of the flexible functional module 520, a side surface S-3c of the flexible window module 530, and a side surface S-4c of the lower flexible module 540 may be located on substantially different planes.

The side surface S-3c of the flexible window module 530 may be located outside the side surface S-1c of the flexible display module 510. For example, the side surface S-3c of the flexible window module 530 may be located outer than the side surface S-1c of the flexible display module 510.

The side surface S-2c of the flexible functional module 520 may be located inside the side surface S-1c of the flexible display module 510. For example, the side surface S-2c of the flexible functional module 520 may be located inner than the side surface S-1c of the flexible display module 510.

The side surface S-4c of the lower flexible module 540 may be located inside the side surface S-1c of the flexible display module 510. The side surface S-4c of the lower flexible module 540 may be located outside the side surface S-2c of the flexible functional module 520.

The side surface of the rigid film 550 may be located on substantially the same plane as the side surface S-4c of the lower flexible module 540. For example, the side surface of the second plate 842 and the side surface of the second double-sided adhesive film 852 may be located on substantially the same plane as the side surface S-4c of the lower flexible module 540.

For example, in FIG. 9, the side surface S-1c of the flexible display module 510, the side surface S-2c of the flexible functional module 520, the side surface S-3c of the flexible window module 530, and the side surface S-4c of the lower flexible module 540 may be substantially parallel with each other and may be substantially perpendicular to the display surface of the flexible display module 510.

The flexible display module 510 may be formed by a laser cutting process using laser light advancing in the first direction DL1 or in the second direction DL2 described with reference to FIG. 2 such that the side surface S-1c of the flexible display module 510 may form an acute angle with the display surface of the flexible display module 510. The acute angle may be an inner angle ranging from about 85 degrees to about 89 degrees. In this case, the side surface S-2c of the flexible functional module 520, the side surface S-3c of the flexible window module 530, and the side surface S-4c of the lower flexible module 540 may be substantially perpendicular to the display surface of the flexible display module 510.

The inorganic-inorganic contact closed loop LOOP_C in the flexible display module 510 may be located inside the side surface S-2c of the flexible functional module 520. The inorganic-inorganic contact closed loop LOOP_C in the flexible display module 510 may be located inside the side surface S-3c of the flexible window module 530. The inorganic-inorganic contact closed loop LOOP_C in the flexible display module 510 may be located inside the side surface S-4c of the flexible window module 540.

As illustrated in FIG. 10, the flexible display module 510 in the bendable region BR may be bent with a curvature radius R in the downward direction (e.g., the direction substantially opposite to the direction in which light from the display surface advances). The entire bendable region BR may have a substantially constant curvature radius. In example embodiments, a portion of the bendable region BR may have a substantially different curvature radius from another portion of the bendable region BR. The surface of the flexible display module 510 may be inverted when the bendable region BR of the flexible display module 510 is bent. For example, the surface of the flexible display module 510 may include first to third portions. The first portion of the surface of the flexible display module 510 may face upwardly in the main region MR. The second portion of the surface of the flexible display module 510 may be connected to the first portion of the flexible display module 510 and may face outwardly in the bendable region BR. The third portion of the surface of the flexible display module 510 may be connected to the second portion of the flexible display module 510 and may face downwardly in the sub region SR.

After the bendable region BR is bent, the sub region SR may extend in a direction substantially parallel with the main region MR. After the bendable region BR is bent, the sub region SR may overlap the main region MR in the thickness direction of the flexible display module 510. After the bendable region BR is bent, the sub region SR may overlap the reduced non-display area RNDA of the main region MR. After the bendable region BR is bent, the sub region SR may overlap the display area DA of the main region MR.

A fifth lower double-sided adhesive film NAD5 may be located between the rigid film 550 (e.g., the second plate 842) and the sub region SR of the flexible display module 510. The sub region SR of the flexible display module 510 may be attached to the rigid film 550.

A plurality of wires may be located in the bendable region BR and the sub region SR. The wires in the bendable region BR may be connected to a circuit layer of the main region MR and extend to the sub region SR. The wires extending in the sub region SR may be connected to a circuit board 1060. The circuit board 1060 may be a flexible printed circuit board. The circuit board 1060 may be provided in the form of film-on-plastic. For example, a contact pad of the circuit board 1060 exposed from an upper surface of the circuit board 1060 may be attached to a terminal of the wire in the sub region SR exposed from the lower surface of the sub region SR. The contact pad of the circuit board 1060 may be attached to the terminal of the wire in the sub region SR by using an anisotropic conductive film.

A passivation film (e.g., a bendable region protective film) may be located on the bendable region BR and the sub region SR of the flexible display module 510. The passivation film may cover and protect wires. The passivation film may serve to reinforce the strength of the flexible substrate or to alleviate the stress in the bendable region BR. For example, the passivation film may include an organic coating including an organic material such as polyimide, acrylate, epoxy, or the like. In example embodiments, the passivation film may be a protective film attached by an adhesive film.

In the vicinity of the first side K1 of the foldable display device 100, a side surface S-2d of the flexible functional module 520, a side surface S-3d of the flexible window module 530, and a side surface S-4d of the lower flexible module 540 may be located on substantially different planes. The relation of position among the side surface S-2d of the flexible functional module 520, the side surface S-3d of the flexible window module 530, and the side surface S-4d of the lower flexible module 540 may be substantially the same as the relation of position among the side surface S-2c of the flexible functional module 520, the side surface S-3c of the flexible window module 530, and the side surface S-4c of the lower flexible module 540. Therefore, redundant description will not be repeated.

The side surface S-3d of the flexible window module 530 may be located on substantially the same plane as the outermost side of the bendable region BR of the flexible display module 510. For example, the outer surface at an intermediate point B1 of the bendable region BR may be located on substantially the same plane as the side surface S-3d of the flexible window module 530. As described in FIG. 4, a first side G1 of the preliminary flexible window module 130 may be located to pass through the center of the bendable region BR (e.g., the bendable region BR before bending). When the bendable region BR is bent, the outer surface at the intermediate point B1 of the bendable region BR may coincide with the side surface S-3d of the flexible window module 530 depending on the curvature of the bendable region BR and the thickness of the flexible window module 530.

As described with reference to FIGS. 6 to 10, at the second to fourth sides K2, K3, and K4 of the foldable display device 100, the side surfaces of the flexible display module 510, the flexible functional module 520, and the flexible window module 530 may have the reverse tilted structure. Damage to the flexible display module 510 and laser equipment may be minimized during forming the second to fourth sides K2, K3, and K4 of the foldable display device 100. In addition, when the side surfaces of the flexible display module 510, the flexible functional module 520, and the flexible window module 530 are arranged on substantially the same plane, the foldable display device 100 may be efficiently inserted into the housing case as compared with a case where the side surfaces do not coincide with one another.

In addition, the inorganic-inorganic contact closed loop LOOP_C of the flexible display module 510 may be separated from the side surface (e.g., edge) of the flexible display module 510 and may be included in the flexible display module 510. Accordingly, permeation of water, oxygen, or the like may be prevented.

Figure 11:
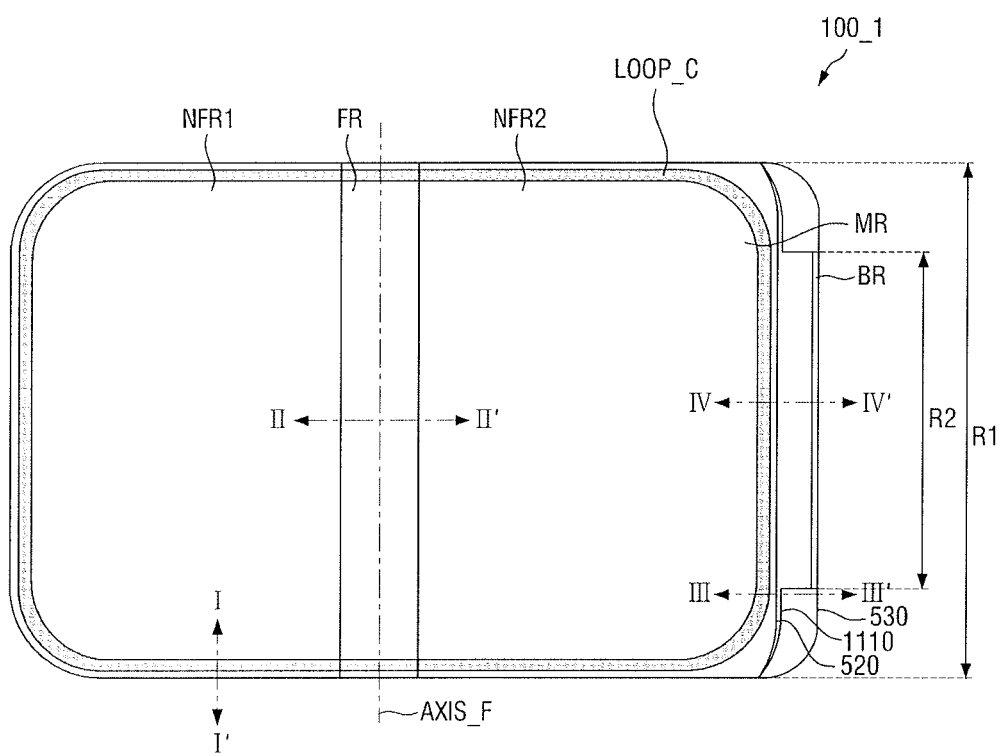
FIG. 11 illustrates a plan view depicting a foldable display device according to an example embodiment.

FIG. 11 illustrates a plan view of a foldable display device according to an example embodiment.

Referring to FIG. 11, a foldable display device 100_1 may include a flexible display module 1110. The flexible display module 1110 may include the bendable region BR and the sub region SR described with reference to FIG. 1.

The bendable region BR of the flexible display module 1110 may be substantially the same as the bendable region BR of the flexible display module 510. The bendable region BR of the flexible display module 1110 may be substantially the same as the bendable region BR of the preliminary flexible display module 110.

However, a length R2 (e.g., a vertical length) of the bendable region BR of the flexible display module 1110 may be substantially greater than the length of the bendable region BR of the flexible display module 510. The length R2 of the bendable region BR of the flexible display module 1110 may be in a range of from about 50% to about 95%, or from about 65% to about 95% of the length R1 of the first side of the flexible display module 1110 (e.g., a distance from the upper side to the lower side).

As the length R2 of the bendable region BR of the flexible display module 1110 becomes substantially greater, the first area A1 (e.g., a region having a cross section taken along line described with reference to FIG. 3) may be decreased. In this case, it may be possible to improve the robustness of the bendable region BR of the foldable display device 100. In addition, a bending of an edge of the flexible window module 530 that may be generated when a size of an area of the flexible window module 530 which is not supported by the flexible display module 510 or the like decreases may be prevented.

Figure 12:
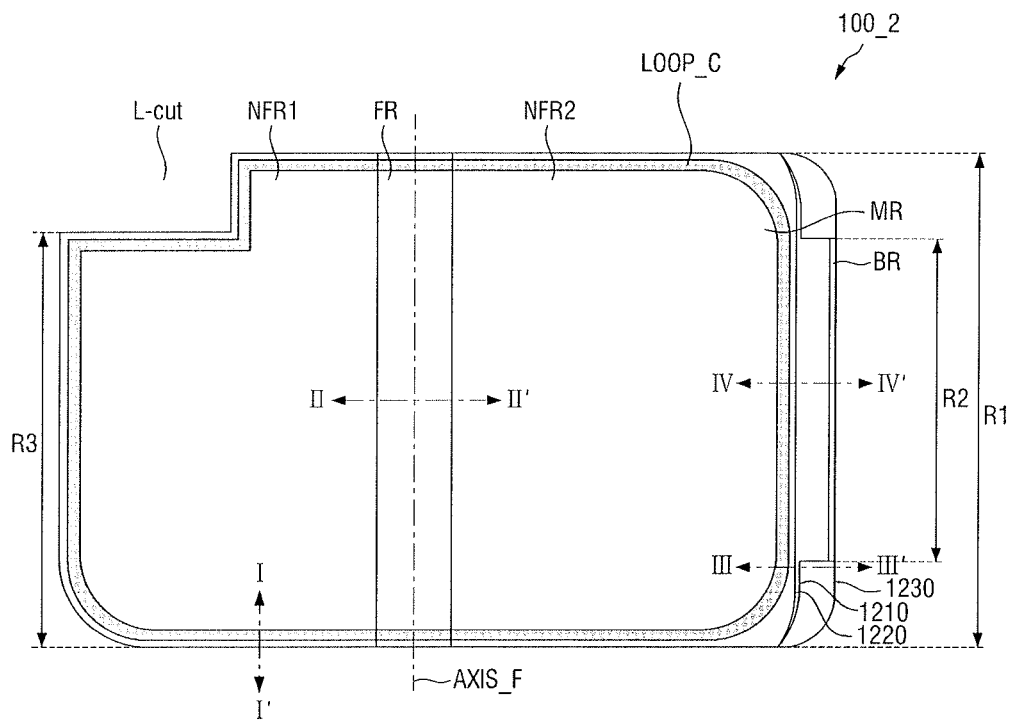
FIG. 12 illustrates a plan view depicting a foldable display device according to an example embodiment.

FIG. 12 illustrates a plan view of the foldable display device according to an example embodiment.

Referring to FIG. 12, a display device 100_2 may include a flexible display module 1210, a flexible functional module 1220, and a flexible window module 1230.

Each of the flexible display module 1210, the flexible functional module 1220 and the flexible window module 1230 may have a cutout portion L-CUT (e.g., a cutting portion) formed on one side (e.g., an upper left corner). The cutout portion L-CUT may have a substantially rectangular shape. The flexible display module 1210, the flexible functional module 1220, and the flexible window module 1230 may have a substantial "L" shape in a plan view.

The cutout portion L-CUT may be formed by the laser cutting described with reference to FIG. 5 such that the cross-section at the cutout portion L-CUT may be substantially the same as the cross-section described with reference to FIG. 7.

The flexible display module 1210 may include an inorganic-inorganic contact closed loop LOOP_C that does not overlap the cutout portion L-CUT. The inorganic-inorganic contact closed loop LOOP_C may include a substantial "L" shape at the upper left side corresponding to the shape of the cutout portion L-CUT and may be located to be spaced apart from the cutout portion L-CUT by a predetermined distance.

A length R3 (e.g., a vertical length) of a third side (e.g. a left side not in contact with the foldable region FR) of the foldable display device 100 may be substantially smaller than the length R1 of the first side (e.g., a right side) of the foldable display device 100. For example, a length of an outer side (e.g., a left side) of a first non-foldable region NFR1 may be substantially smaller than the length of the inner side (e.g., a right side) of the first non-foldable region NFR1. The length of the outer side of the first non-foldable region NFR1 may be substantially smaller than the length of the outer side of a second non-foldable region NFR2.

The bendable region BR of the flexible display module 1210 may be formed on the first side substantially opposite to the third side based on the foldable region FR or may extend from the first side.

A length R2 of the bendable region BR of the flexible display module 1210 may be within a range of from about 50 to about 95% or a range of from about 65 to about 95% of the length R1 (e.g., a distance from the upper side up to the lower side) of the first side of the flexible display module 1210.

By way of summation and review, according to the foldable display device of an example embodiment, a side surface of a flexible display module and the side surface of a window module may form an acute angle with a display surface. Accordingly, damage to the flexible display module may be minimized when the flexible display module and the window module are cut, a quality of a display device may be enhanced, and a width of the window module may be relatively reduced, thereby facilitating mounting of a housing case of the display device.

Example embodiments provide a foldable display device that is easily manufactured and has enhanced quality and a manufacturing method thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular example embodiment may be used singly or in combination with features, characteristics, and/or elements described in connection with other example embodiments unless otherwise specifically indicated. Accordingly, it will be understood by those of skill in the art that various changes in form and details may be made without departing from the spirit and scope thereof as set forth in the following claims.

What is claimed is:

1. A foldable display device, comprising:
   a flexible display module including a main region which has a display area including an electroluminescent unit;
   a flexible functional module on the flexible display module, the flexible functional module having at least one function selected from a group of polarization, color filtering, color conversion, and touch sensing;
   a first double-sided adhesive film on the flexible functional module; and
   a flexible window module on the first double-sided adhesive film,
   wherein, at a first side portion of the foldable display device, at least one selected from a group of a side surface portion of the flexible display module and a side surface portion of the flexible functional module is located substantially on a first etching plane substantially on which a side surface portion of the flexible window module is located, the first side portion of the foldable display device having a first sidewall shape,
   the flexible display module includes a lower inorganic encapsulation structure and an upper encapsulation structure which has a lower surface including only at least one inorganic material,
   the flexible display module includes an inorganic-inorganic contact closed loop at which the lower surface of the upper encapsulation structure contacts the lower inorganic encapsulation structure,
   the electroluminescent unit is located between the lower inorganic encapsulation structure and the upper encapsulation structure,
   the electroluminescent unit is surrounded by the inorganic-inorganic contact closed loop in plan view,
   the inorganic-inorganic contact closed loop is spaced apart from the side surface portion of the flexible display module, the foldable display device has a second side portion having a second sidewall shape substantially different from the first sidewall shape of the first side portion, the foldable display device has a third side portion having a third sidewall shape substantially different from the first and second sidewall shapes of the first and second side portions, the flexible display module further includes a sub region in which a pad is provided and a bent region located at the third side portion of the foldable display device and bent between the main region and the sub region, and the second side portion of the foldable display device is located between the first and third side portions of the foldable display device in plan view.

2. The foldable display device as claimed in claim 1, wherein, at the first side portion of the foldable display device, the side surface portion of the flexible display module and the side surface portion of the flexible functional module are located substantially on the first etching plane.

3. The foldable display device as claimed in claim 1, wherein a foldable region of the foldable display device has a side portion which is included in the first side portion of the foldable display device.

4. The foldable display device as claimed in claim 1, wherein
    at the second side portion of the foldable display device, a side surface portion of the flexible window module is located substantially on a second plane, and
    at the second side portion of the foldable display device, a side surface portion of the flexible display module is located substantially on a third plane located inside the second plane in plan view.

5. The foldable display device as claimed in claim 4, wherein, at the second side portion of the foldable display device, a side surface portion of the flexible functional module is located substantially on a fourth plane located inside the third plane in plan view.

6. The foldable display device as claimed in claim 4, further comprising:
    a second double-sided adhesive film under the flexible display module; and
    a lower flexible module located under the second double-sided adhesive film,
    wherein, at the second side portion of the foldable display device, a side surface portion of the lower flexible module is located substantially on a fifth plane located inside the third plane in plan view.

7. The foldable display device as claimed in claim 4, wherein, at the third side portion of the foldable display device, an outermost portion of the bent region is aligned to be located just under a side surface portion of the flexible window module.

8. The foldable display device as claimed in claim 4, wherein, at the first side portion of the foldable display device, the side surface portion of the flexible display module and the side surface portion of the flexible functional module are located substantially on the first etching plane, and
    at the second side portion of the foldable display device, a side surface portion of the flexible functional module is located substantially on a fourth plane located inside the third plane in plan view.

9. The foldable display device as claimed in claim 8, wherein, at the third side portion of the foldable display device, an outermost portion of the bent region is aligned to be located just under a side surface portion of the flexible window module.

10. The foldable display device as claimed in claim 1, wherein, at the third side portion of the foldable display device, an outermost portion of the bent region is aligned to be located just under a side surface portion of the flexible window module.

11. The foldable display device as claimed in claim 1, wherein
    at the second side portion of the foldable display device, a side surface portion of the flexible window module is located substantially on a second plane, and
    at the second side portion of the foldable display device, at least one selected from a group of a side surface portion of the flexible display module and a side surface portion of the flexible functional module is not located substantially on the second plane.

12. The foldable display device as claimed in claim 11, wherein the first side portion of the foldable display device continues to the second side portion of the foldable display device.

13. The foldable display device as claimed in claim 11, wherein the first side portion of the foldable display device is substantially longer than the second side portion of the foldable display device in plan view.

14. The foldable display device as claimed in claim 13, wherein the foldable display device has a foldable region and a non-foldable region,
    the foldable region of the foldable display device has a side portion which is included in the first side portion of the foldable display device, and
    the second side portion of the foldable display device is located in the non-foldable region of the foldable display device.

15. The foldable display device as claimed in claim 1, wherein the foldable display device has a foldable region and a non-foldable region,
    the foldable region of the foldable display device has a side portion which is included in the first side portion of the foldable display device,
    the third side portion of the foldable display device is located in the non-foldable region of the foldable display device, and
    the first side portion of the foldable display device is substantially longer than the third side portion of the foldable display device in plan view.

16. The foldable display device as claimed in claim 1, wherein the flexible display module comprises:
    a transistor electrically connected to the electroluminescent unit;
    a first organic flexible film under the transistor;
    a second double-sided adhesive film under the first organic flexible film; and
    a second organic flexible film under the second double-sided adhesive film.

17. The foldable display device as claimed in claim 16, wherein the foldable display device further comprises:
    a third double-sided adhesive film located under the flexible display module; and
    a lower flexible module located under the third double-sided adhesive film, and
    a base film is located under the lower flexible module and has first and second rigid plate portions between which a foldable region of the foldable display device is located.

18. A foldable display device, comprising:
    a flexible display module including a main region which has a display area including an electroluminescent unit;

a flexible functional module on the flexible display module, the flexible functional module having at least one function selected from a group of polarization, color filtering, color conversion, and touch sensing;
a first double-sided adhesive film on the flexible functional module; and
a flexible window module on the first double-sided adhesive film,
wherein, at a first side portion of the foldable display device, a side surface portion of the flexible functional module is located substantially on a first etching plane substantially on which a side surface portion of the flexible display module is located, the first side portion of the foldable display device having a first sidewall shape,
the flexible display module includes a lower inorganic encapsulation structure and an upper encapsulation structure which has a lower surface including only at least one inorganic material,
the flexible display module includes an inorganic-inorganic contact closed loop at which the lower surface of the upper encapsulation structure contacts the lower inorganic encapsulation structure,
the electroluminescent unit is located between the lower inorganic encapsulation structure and the upper encapsulation structure,
the electroluminescent unit is surrounded by the inorganic-inorganic contact closed loop in plan view,
the inorganic-inorganic contact closed loop is spaced apart from the side surface portion of the flexible display module,
the foldable display device has a second side portion having a second sidewall shape substantially different from the first sidewall shape of the first side portion,
the foldable display device has a third side portion having a third sidewall shape substantially different from the first and second sidewall shapes of the first and second side portions,
the flexible display module further includes a sub region in which a pad is provided and a bent region located at the third side portion of the foldable display device and bent between the main region and the sub region, and
the second side portion of the foldable display device is located between the first and third side portions of the foldable display device in plan view.

19. The foldable display device as claimed in claim 18, wherein a foldable region of the foldable display device has a side portion which is included in the first side portion of the foldable display device.

20. The foldable display device as claimed in claim 18, wherein
at the second side portion of the foldable display device, a side surface portion of the flexible display module is located substantially on a third plane, and
at the second side portion of the foldable display device, a side surface portion of the flexible functional module is located substantially on a fourth plane located inside the third plane in plan view.

21. The foldable display device as claimed in claim 20, further comprising:
a second double-sided adhesive film under the flexible display module; and
a lower flexible module located under the second double-sided adhesive film,
wherein, at the second side portion of the foldable display device, a side surface portion of the lower flexible module is located substantially on a fifth plane located inside the third plane in plan view.

22. The foldable display device as claimed in claim 18, wherein the foldable display device has a foldable region and a non-foldable region,
the foldable region of the foldable display device has a side portion which is included in the first side portion of the foldable display device,
the third side portion of the foldable display device is located in the non-foldable region of the foldable display device, and
the first side portion of the foldable display device is substantially longer than the third side portion of the foldable display device in plan view.

23. The foldable display device as claimed in claim 18, wherein
at the second side portion of the foldable display device, a side surface portion of the flexible window module is located substantially on a second plane, and
at the second side portion of the foldable display device, at least one selected from a group of a side surface portion of the flexible display module and a side surface portion of the flexible functional module is not located substantially on the second plane.

24. The foldable display device as claimed in claim 23, wherein the first side portion of the foldable display device continues to the second side portion of the foldable display device.

25. The foldable display device as claimed in claim 23, wherein the first side portion of the foldable display device is substantially longer than the second side portion of the foldable display device in plan view.

26. The foldable display device as claimed in claim 25, wherein the foldable display device has a foldable region and a non-foldable region,
the foldable region of the foldable display device has a side portion which is included in the first side portion of the foldable display device, and
the second side portion of the foldable display device is located in the non-foldable region of the foldable display device.

27. The foldable display device as claimed in claim 18, wherein the flexible display module comprises:
a transistor electrically connected to the electroluminescent unit;
a first organic flexible film under the transistor;
a second double-sided adhesive film under the first organic flexible film; and
a second organic flexible film under the second double-sided adhesive film.

28. The foldable display device as claimed in claim 27, wherein the foldable display device further comprises:
a third double-sided adhesive film located under the flexible display module; and
a lower flexible module located under the third double-sided adhesive film, and
a base film is located under the lower flexible module and has first and second rigid plate portions between which a foldable region of the foldable display device is located.

29. A mobile terminal with a foldable display device, the foldable display device providing an image displayed from the mobile terminal, wherein the improvement comprises that the foldable display device comprises:
a flexible display module including a main region which has a display area including an electroluminescent unit;

a flexible functional module on the flexible display module, the flexible functional module having at least one function selected from a group of polarization, color filtering, color conversion, and touch sensing;

a first double-sided adhesive film on the flexible functional module; and a flexible window module on the first double-sided adhesive film, wherein, at a first side portion of the foldable display device, at least one selected from a group of a side surface portion of the flexible display module and a side surface portion of the flexible functional module is located substantially on a first etching plane substantially on which a side surface portion of the flexible window module is located, the first side portion of the foldable display device having a first sidewall shape, the flexible display module includes a lower inorganic encapsulation structure and an upper encapsulation structure which has a lower surface including only at least one inorganic material, the flexible display module includes an inorganic-inorganic contact closed loop at which the lower surface of the upper encapsulation structure contacts the lower inorganic encapsulation structure, the electroluminescent unit is located between the lower inorganic encapsulation structure and the upper encapsulation structure, the electroluminescent unit is surrounded by the inorganic-inorganic contact closed loop in plan view, the inorganic-inorganic contact closed loop is spaced apart from the side surface portion of the flexible display module, the foldable display device has a second side portion having a second sidewall shape substantially different from the first sidewall shape of the first side portion, the foldable display device has a third side portion having a third sidewall shape substantially different from the first and second sidewall shapes of the first and second side portions, the flexible display module further includes a sub region in which a pad is provided and a bent region located at the third side portion of the foldable display device and bent between the main region and the sub region, and the second side portion of the foldable display device is located between the first and third side portions of the foldable display device in plan view.

30. The mobile terminal as claimed in claim 29, wherein, at the first side portion of the foldable display device, the side surface portion of the flexible display module and the side surface portion of the flexible functional module are located substantially on the first etching plane.

31. The mobile terminal as claimed in claim 29, wherein a foldable region of the foldable display device has a side portion which is included in the first side portion of the foldable display device.

32. The mobile terminal as claimed in claim 29 wherein at the second side portion of the foldable display device,
a side surface portion of the flexible window module is located substantially on a second plane, and
at the second side portion of the foldable display device, a side surface portion of the flexible display module is located substantially on a third plane located inside the second plane in plan view.

33. The mobile terminal as claimed in claim 32, wherein, at the second side portion of the foldable display device, a side surface portion of the flexible functional module is located substantially on a fourth plane located inside the third plane in plan view.

34. The mobile terminal as claimed in claim 32, further comprising:
a second double-sided adhesive film under the flexible display module; and
a lower flexible module located under the second double-sided adhesive film,
wherein, at the second side portion of the foldable display device, a side surface portion of the lower flexible module is located substantially on a fifth plane located inside the third plane in plan view.

35. The mobile terminal as claimed in claim 32, wherein, at the third side portion of the foldable display device, an outermost portion of the bent region is aligned to be located just under a side surface portion of the flexible window module.

36. The mobile terminal as claimed in claim 32, wherein, at the first side portion of the foldable display device, the side surface portion of the flexible display module and the side surface portion of the flexible functional module are located substantially on the first etching plane, and
at the second side portion of the foldable display device, a side surface portion of the flexible functional module is located substantially on a fourth plane located inside the third plane in plan view.

37. The mobile terminal as claimed in claim 36, wherein, at the third side portion of the foldable display device, an outermost portion of the bent region is aligned to be located just under a side surface portion of the flexible window module.

38. The mobile terminal as claimed in claim 29, wherein, at the third side portion of the foldable display device, an outermost portion of the bent region is aligned to be located just under a side surface portion of the flexible window module.

39. The mobile terminal as claimed in claim 29, wherein the foldable display device has a foldable region and a non-foldable region,
the foldable region of the foldable display device has a side portion which is included in the first side portion of the foldable display device,
the third side portion of the foldable display device is located in the non-foldable region of the foldable display device, and
the first side portion of the foldable display device is substantially longer than the third side portion of the foldable display device in plan view.

40. The mobile terminal as claimed in claim 29, wherein at the second side portion of the foldable display device,
a side surface portion of the flexible window module is located substantially on a second plane, and
at the second side portion of the foldable display device, at least one selected from a group of a side surface portion of the flexible display module and a side surface portion of the flexible functional module is not located substantially on the second plane.

41. The mobile terminal as claimed in claim 40, wherein the first side portion of the foldable display device continues to the second side portion of the foldable display device.

42. The mobile terminal as claimed in claim 40, wherein the first side portion of the foldable display device is substantially longer than the second side portion of the foldable display device in plan view.

43. The mobile terminal as claimed in claim 42, wherein the foldable display device has a foldable region and a non-foldable region,
  the foldable region of the foldable display device has a side portion which is included in the first side portion of the foldable display device, and
  the second side portion of the foldable display device is located in the non-foldable region of the foldable display device.

44. The mobile terminal as claimed in claim 29, wherein the flexible display module comprises:
  a transistor electrically connected to the electroluminescent unit;
  a first organic flexible film under the transistor;
  a second double-sided adhesive film under the first organic flexible film; and
  a second organic flexible film under the second double-sided adhesive film.

45. The mobile terminal as claimed in claim 44, wherein the foldable display device further comprises:
  a third double-sided adhesive film located under the flexible display module; and
  a lower flexible module located under the third double-sided adhesive film, and
  a base film is located under the lower flexible module and has first and second rigid plate portions between which a foldable region of the foldable display device is located.

46. A mobile terminal with a foldable display device, the foldable display device providing an image displayed from the mobile terminal, wherein the improvement comprises that the foldable display device comprises:
  a flexible display module including a main region which has a display area including an electroluminescent unit;
  a flexible functional module on the flexible display module, the flexible functional module having at least one function selected from a group of polarization, color filtering, color conversion, and touch sensing;
  a first double-sided adhesive film on the flexible functional module; and
  a flexible window module on the first double-sided adhesive film,
  wherein, at a first side portion of the foldable display device, a side surface portion of the flexible functional module is located substantially on a first etching plane substantially on which a side surface portion of the flexible display module is located, the first side portion of the foldable display device having a first sidewall shape,
  the flexible display module includes a lower inorganic encapsulation structure and an upper encapsulation structure which has a lower surface including only at least one inorganic material,
  the flexible display module includes an inorganic-inorganic contact closed loop at which the lower surface of the upper encapsulation structure contacts the lower inorganic encapsulation structure,
  the electroluminescent unit is located between the lower inorganic encapsulation structure and the upper encapsulation structure,
  the electroluminescent unit is surrounded by the inorganic-inorganic contact closed loop in plan view,
  the inorganic-inorganic contact closed loop is spaced apart from the side surface portion of the flexible display module,
  the foldable display device has a second side portion having a second sidewall shape substantially different from the first sidewall shape of the first side portion,
  the foldable display device has a third side portion having a third sidewall shape substantially different from the first and second sidewall shapes of the first and second side portions,
  the flexible display module further includes a sub region in which a pad is provided and a bent region located at the third side portion of the foldable display device and bent between the main region and the sub region, and
  the second side portion of the foldable display device is located between the first and third side portions of the foldable display device in plan view.

47. The mobile terminal as claimed in claim 46, wherein a foldable region of the foldable display device has a side portion which is included in the first side portion of the foldable display device.

48. The mobile terminal as claimed in claim 46, wherein
  at the second side portion of the foldable display device, a side surface portion of the flexible display module is located substantially on a third plane, and
  at the second side portion of the foldable display device, a side surface portion of the flexible functional module is located substantially on a fourth plane located inside the third plane in plan view.

49. The mobile terminal as claimed in claim 48, further comprising:
  a second double-sided adhesive film under the flexible display module; and
  a lower flexible module located under the second double-sided adhesive film,
  wherein, at the second side portion of the foldable display device, a side surface portion of the lower flexible module is located substantially on a fifth plane located inside the third plane in plan view.

50. The mobile terminal as claimed in claim 46, wherein the foldable display device has a foldable region and a non-foldable region,
  the foldable region of the foldable display device has a side portion which is included in the first side portion of the foldable display device,
  the third side portion of the foldable display device is located in the non-foldable region of the foldable display device, and
  the first side portion of the foldable display device is substantially longer than the third side portion of the foldable display device in plan view.

51. The mobile terminal as claimed in claim 46, wherein
  at the second side portion of the foldable display device, a side surface portion of the flexible window module is located substantially on a second plane, and
  at the second side portion of the foldable display device, at least one selected from a group of a side surface portion of the flexible display module and a side surface portion of the flexible functional module is not located substantially on the second plane.

52. The mobile terminal as claimed in claim 51, wherein the first side portion of the foldable display device continues to the second side portion of the foldable display device.

53. The mobile terminal as claimed in claim 51, wherein the first side portion of the foldable display device is substantially longer than the second side portion of the foldable display device in plan view.

54. The mobile terminal as claimed in claim 53, wherein the foldable display device has a foldable region and a non-foldable region, the foldable region of the foldable display device has a side portion which is included in the first side portion of the foldable display device, and the second side portion of the foldable display device is located in the non-foldable region of the foldable display device.

55. The mobile terminal as claimed in claim 46, wherein the flexible display module comprises:

a transistor electrically connected to the electroluminescent unit;

a first organic flexible film under the transistor;

a second double-sided adhesive film under the first organic flexible film; and a second organic flexible film under the second double-sided adhesive film.

56. The mobile terminal as claimed in claim 55, wherein the foldable display device further comprises:

a third double-sided adhesive film located under the flexible display module; and a lower flexible module located under the third double-sided adhesive film, and a base film is located under the lower flexible module and has first and second rigid plate portions between which a foldable region of the foldable display device is located.

* * * * *